(12) United States Patent
Donnelly et al.

(10) Patent No.: US 10,515,782 B2
(45) Date of Patent: Dec. 24, 2019

(54) ATOMIC LAYER ETCHING WITH PULSED PLASMAS

(71) Applicant: University of Houston System, Houston, TX (US)

(72) Inventors: Vincent M. Donnelly, Houston, TX (US); Demetre J. Economou, Houston, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 101 days.

(21) Appl. No.: 15/949,274

(22) Filed: Apr. 10, 2018

(65) Prior Publication Data
US 2018/0226227 A1    Aug. 9, 2018

Related U.S. Application Data

(62) Division of application No. 12/966,844, filed on Dec. 13, 2010, now abandoned.

(60) Provisional application No. 61/286,572, filed on Dec. 15, 2009.

(51) Int. Cl.
*H01L 21/306* (2006.01)
*H01J 37/32* (2006.01)
*H01L 21/3065* (2006.01)

(52) U.S. Cl.
CPC .. *H01J 37/32174* (2013.01); *H01J 37/32036* (2013.01); *H01J 37/32045* (2013.01); *H01J 37/32082* (2013.01); *H01J 37/32146* (2013.01); *H01L 21/30655* (2013.01)

(58) Field of Classification Search
USPC ................................................. 216/67
See application file for complete search history.

(56) References Cited

U.S. PATENT DOCUMENTS

| | | | |
|---|---|---|---|
| 5,571,366 A | 11/1996 | Ishii et al. | |
| 6,193,855 B1 * | 2/2001 | Gopalraja | C23C 14/046 204/192.12 |
| 6,232,236 B1 | 5/2001 | Shan et al. | |

(Continued)

FOREIGN PATENT DOCUMENTS

| | | |
|---|---|---|
| CN | 101426949 A | 5/2009 |
| JP | H01-149965 A | 6/1989 |

(Continued)

OTHER PUBLICATIONS

Chinese Office Action dated Dec. 15, 2015, for Chinese Application No. 201080026879.7 (3 p.)

(Continued)

*Primary Examiner* — Roberts P Culbert
(74) *Attorney, Agent, or Firm* — Conley Rose, P.C.

(57) ABSTRACT

A system and method for rapid atomic layer etching (ALET) including a pulsed plasma source, with a spiral coil electrode, a cooled Faraday shield, a counter electrode disposed at the top of the tube, a gas inlet and a reaction chamber including a substrate support and a boundary electrode. The method includes positioning an etchable substrate in a plasma etching chamber, forming a product layer on the surface of the substrate, removing a portion of the product layer by pulsing a plasma source, then repeating the steps of forming a product layer and removing a portion of the product layer to form an etched substrate.

15 Claims, 18 Drawing Sheets

(56) References Cited

U.S. PATENT DOCUMENTS

| | | |
|---|---|---|
| 6,310,577 B1 | 10/2001 | Ra |
| 6,352,049 B1 | 3/2002 | Yin et al. |
| 6,367,413 B1 | 4/2002 | Sill et al. |
| 2004/0094400 A1 | 5/2004 | Ichiki et al. |
| 2004/0259380 A1 | 12/2004 | Fukuda et al. |
| 2007/0186855 A1 | 8/2007 | Dhindsa |
| 2007/0199658 A1 | 8/2007 | Dhindsa et al. |
| 2008/0295964 A1 | 12/2008 | Takahashi |

FOREIGN PATENT DOCUMENTS

| | | |
|---|---|---|
| JP | H03-263827 A | 11/1991 |
| JP | H04-279044 A | 10/1992 |
| JP | H04279044 A | 10/1992 |
| JP | H05-275378 A | 10/1993 |
| JP | H11-224796 A | 8/1999 |
| JP | 2001-358129 A | 12/2001 |
| JP | 2002-289584 A | 10/2002 |
| JP | 2003038950 A | 2/2003 |
| WO | 2007100528 A2 | 9/2007 |

OTHER PUBLICATIONS

English Translation of Chinese Office Action dated Dec. 15, 2015, for Chinese Application No. 201080026879.7 (3 p.).
Taiwanese Rejection Decision dated Oct. 27, 2015, for Taiwanese Application No. 099143897 (14 p.).
English Translation of Taiwanese Rejection Decision dated Oct. 27, 2015, for Taiwanese Application No. 399143897 (14 p.).
Japanese Office Action dated Sep. 24, 2015, for Japanese Application No. 2013-217145 (4 p.).
English Translation of Japanese Office Action dated Sep. 24, 2015, for Japanese Application No. 2013-217145 (3 p.).
Chinese Office Action dated Jun. 12, 2015, for Chinese Application No. 201080026879.7 (3 p.).
English Translation of Chinese Office Action dated Jun. 12, 2015, for Chinese Application No. 201080026879.7 (4 p.).
Chinese Office Action dated Nov. 14, 2014; Chinese Application No. 201080026879.7 (8 p.).
English Translation of Chinese Office Action dated Nov. 14, 2014; Chinese Application No. 201080026879.7 (13 p.).
Japanese Office Action dated Dec. 9, 2014; Japanese Application No. 2013-217145 (3 p.).
English Translation of Japanese Office Action dated Dec. 9, 2014; Japanese Application No. 2013-217145 (3 p.).
Japanese Office Action dated May 19, 2015, for Japanese Application No. 2012-515234 (11 p.).
English Translation of Japanese Office Action dated May 19, 2015, for Japanese Application No. 2012-515234 (9 p.).
Taiwanese Examination Report dated Mar. 17, 2015, for Taiwanese Application No. 099143897 (12 p.).
English Translation of Taiwanese Examination Report dated Mar. 17, 2015, for Taiwanese Application No. 099143897 (12 p.).
Agarwal, A., et al., "Plasma Atomic Layer Etching Using Conventional Plasma Equipment," Journal of Vacuum Science & Technology, American Vacuum Society, vol. 27, No. 1, Jan. 2009, pp. 37-50 (14 p.).
PCT/US2010/060251 International Search Report and Written Opinion dated Nov. 22, 2012 (15 p.)

\* cited by examiner

ATOMIC LAYER ETCHING WITH PULSED PLASMAS

CROSS-REFERENCE TO RELATED APPLICATIONS

This is a Divisional Application of U.S. patent application Ser. No. 12/966,844 filed Dec. 13, 2010, published as U.S. 2011/0139748A1, entitled "Atomic Layer Etching with Pulsed Plasmas," which claims the benefit of U.S. Provisional Application No. 61/286,572 filed Dec. 15, 2009, entitled "Atomic Layer Etching with Pulsed Plasmas," the disclosure of which is hereby incorporated by reference herein in its entirety for all purposes.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Grant Nos. DE-PS02-09ER09-01 awarded by the U.S. Department of Energy and CBET-0903426 awarded by the National Science Foundation.

BACKGROUND OF THE INVENTION

Field of the Invention

The present disclosure relates to a nanofabrication process. More specifically, the present disclosure relates to new cyclic process for etching a solid surface with atomic layer precision.

Background of the Invention

Atomic layer deposition (ALD) is a nanofabrication process that has become an important method for the growth of high dielectric constant materials, also known as "high-k materials," for replacement of silicon oxides ($SiO_2$) as the gate dielectric in metal-oxide-semiconductor field-effect-transistors (MOSFETs). Atomic layer etching (ALET), also known as "digital etching" has developed as an alternate process to ALD. ALET was first reported for gallium arsenide (GaAs) etching with alternating chlorine gas ($Cl_2$) adsorption and electron beam etching. With the development of these techniques, additional research explored the possibility of ion bombardment to effect ALET of silicon, but the necessary period for each etch cycle exceeds the acceptable limits even at the laboratory scale.

A complete cycle of the traditional approach to atomic layer etching (ALET) consists of four steps. First, the chemisorption step, including clean substrate exposure to a reactant gas to facilitate the adsorption of the gas onto the surface. Second, excess $Cl_2$ gas is purged with an inert gas flow to avoid etching by a gas-phase reactant in the subsequent step. Third, the reaction step, such as chemical sputtering, is affected between the adsorbed gas and the underlying solid reaction, often via inert gas plasma. Ideally, this process is also self-limiting; ions react only with substrate atoms bonded to the chemisorbed gas. Once the chlorinated layer is removed, further etching by physical sputtering of the substrate must not occur or be sufficiently limited. Finally, the evacuation of the reaction chamber exhausts the etching products. If the periods of chemisorption in the first step and the etching third step are for sufficiently extended durations, the etching rate approaches one atomic layer per cycle, where the atomic layer thickness is that of the chlorinated layer, but not necessarily one monolayer of the substrate. Additionally, if the substrate surface remains nearly-atomically smooth during repeated ALET cycling, it is possible to achieve the ideal condition of removal of substantially one monolayer of the substrate per cycle.

However, the achievement of nearly atomic monolayer, substrate removal with traditional ALET processes requires a very long etching cycle, approaching and exceeding 150 seconds per cycle. Further, traditional ALET processes include additional limitations. First, gas pulsing is a disadvantage, exacerbated by the fact that chemisorption gases, such as $Cl_2$, have a long residence time on the chamber walls and require long pumping periods before the inert gas plasma is ignited. This makes the etching rate very slow, even for the times required to etch very thin films. Second, the etching rate per cycle may not necessarily be constant or controllable. Specifically, the ion bombardment induced roughening can cause the saturated layer thickness to increase with cycle number, and accelerate the etching rate with each cycle number.

Moore's law and the continued development of semiconductors predict that devices in future integrated circuits will be as small as one atomic layer thick and less than several atomic layers wide. Present plasma etching processes are too coarse to achieve such precise pattern transfer and can damage underlying layers of the substrate. In particular, traditional plasma etching techniques do not have the level of control that is needed for precise patterning of sub-20 nm structures and the current atomic layer etching with pulsed gases is too slow to be practical for large volume manufacturing of future integrated circuits. Additionally, the current techniques require an excess of precursor raw materials, such as chlorine gas, which represents potential cost reductions for finding more efficient processes.

Therefore, a novel method is needed if atomic layer etching is to overcome the problems of slow etch cycle time, substrate damage, poor resolution, and inefficient operation, thus enabling the use of plasma etching to fabricate future nanodevices incorporating quantum dots and/or wires, self-assembled films, and other sensitive components with atomic layer resolution with improved cost efficiency.

BRIEF SUMMARY

A system according to one embodiment of the disclosure comprising a pulsed plasma source, comprising: spiral coil electrode disposed around a tube; a Faraday shield disposed between the tube and the spiral coil electrode and cooled by a fluid flow; a counter electrode at least partially extending from the top of the tube into the tube; a gas inlet disposed in the tube and in fluid communication with a process gas supply; and a reaction chamber in fluid communication with the pulsed plasma source comprising: a substrate support; and a boundary electrode.

A method for etching a substrate according to one embodiment of the disclosure, comprising introducing a feed gas comprising a mixture of inert gas and reactant gas, into a plasma chamber; disposing the substrate in the plasma chamber; generating a plasma containing reactants and ions from the feed gas; saturating a substrate surface with the reactants to form a product layer comprising a monolayer of the reactant species and a first monolayer atoms of the substrate; and removing the product layer by exposing the product layer to the ions.

A method for processing a substrate according to one embodiment of the disclosure comprising, directing ions from plasma afterglow toward a substrate surface saturated with a first substance. And in certain embodiments, removing the first substance and a monolayer of substrate atoms with the ions.

The foregoing has outlined rather broadly the features and technical advantages of the invention in order that the detailed description of the invention that follows may be better understood. Additional features and advantages of the invention will be described hereinafter that form the subject of the claims of the invention.

BRIEF DESCRIPTION OF THE FIGURES

For a detailed description of the preferred embodiments of the invention, reference will now be made to the accompanying drawings in which.

DETAILED DESCRIPTION

Figure 1:
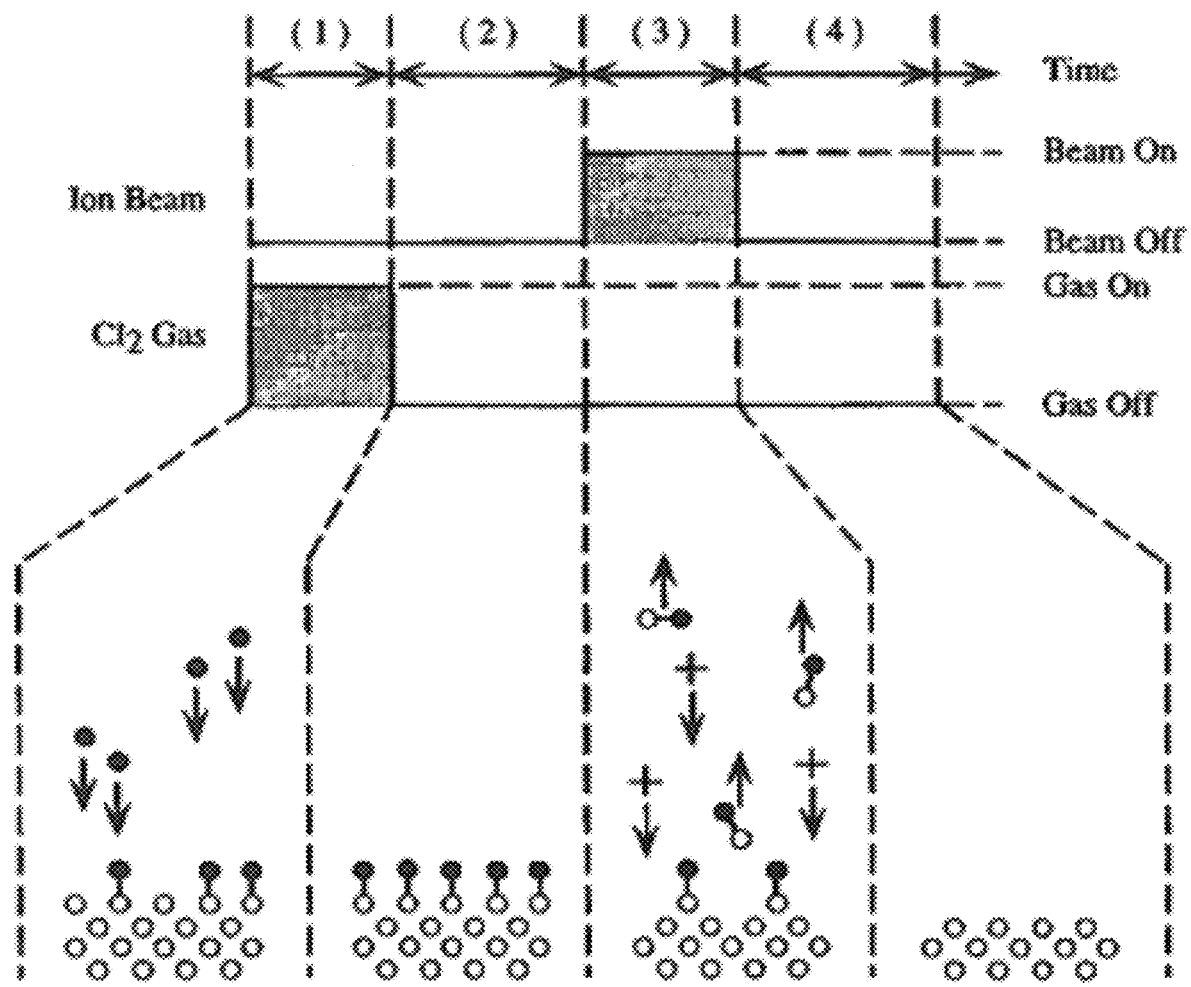
FIG. 1 illustrates traditional Atomic Layer Etching (ALET) process.

Conventional Atomic Layer Etching:

As shown in FIG. 1, traditional atomic layer etching (ALET) process may include four stages: exposing a substrate, such as silicon (Si), to a reactant gas such as chlorine (Cl); purging the excess reactant gas from the chamber; exposing the adsorbed reactant gas to an energetic flux such as a plasma; and exhausting the chamber of etching products, such as silicon chloride radicals ($SiCl_x$), where x is between about 0 and about 4.

The first step comprises a chemisorption step (1). A clean substrate, typically comprising silicon, is exposed to a reactant gas, such as chlorine ($Cl_2$). The reactant gas adsorption is self-limiting as the chemisorption stops when all available surface sites are occupied. The reactant gas flow is only activated during this chemisorption step. The second step (2) is necessary to remove the excess reactant gas that may be in proximity to the substrate or the substrate surface and prevent temporary deposition on the chamber walls. More specifically, purging of excess reactant gas ($Cl_2$) may avoid spontaneous etching by gas-phase reactant released from the walls in the subsequent etching step (3). Spontaneous etching caused by excess or lingering reactant gas eliminates the possibility of monolayer precision. In the third step (3) the surface of the substrate is exposed to an energetic flux, such as ions, electrons, or fast neutrals often via inert gas plasma, such as inductively coupled plasma (ICP) to effect the reaction between the adsorbed gas and the underlying solid. The reaction or chemical sputtering is also self-limiting, because the ions react only with substrate atoms bonded to the chemisorbed gas. Once the chemisorbed layer is removed, additional etching of the substrate is not desirable to maintain approximately single atomic layer etching resolution. Finally, the chamber is evacuated to remove the etching products and any substrate-reactant gas radicals that may be present.

It is noted that this traditional ALET process requires a very long etching cycle that is, for example, about 150 seconds (s) per cycle. Further, extending the periods of chemisorption (1) and etching (3), the etching rate approaches one atomic layer per cycle but at the expense of increased cycle times and decreased process efficiency. If the substrate surface remains at or nearly atomically smooth during repeated ALET cycling, it is possible to achieve the ideal condition of removal of substantially one monolayer of the substrate per cycle. However, if the process overly extended, the atomic layer thickness is that of the chlorinated layer, and not necessarily one monolayer of the substrate, thereby at least partially failing the objective of ALET.

Novel ALET Overview:

In the present disclosure, several exemplary embodiments of the techniques and systems for ALET process are disclosed. For the purposes of clarity and simplicity, the disclosure is made focusing on one or more specific exemplary systems and one or more specific particular techniques. Those skilled in the art will recognize that the embodiments are exemplary only. The disclosure is not to be limited in scope by the specific embodiments described herein. Indeed, other various embodiments of and modification to the present disclosure, in addition to those described herein, will be apparent to those of ordinary skill in the art.

The system and method for new ALET process may be pulsed-plasma and pulsed-electrode bias voltages based process. In embodiments, the system may include a plasma source such as ICP source, capacitively coupled plasma (CCP) source, or helicon source. In certain embodiments, the plasma source is an ICP source. The plasma source may be provided with DC or radio-frequency (RF) power in a continuous or pulsed current. In some embodiments, at least one electrode is disposed near the substrate or immersed in the plasma. In some instances, the ICP pulsing system has at least one radio-frequency (RF) power generator for creating rapid RF plasma pulses. In additional instances, the rapid ALET system comprises electrodes positioned in the reaction chamber for biasing the chamber, biasing the chamber wall, and biasing the plasma. In alternate configurations the plasma pulsing system comprises a secondary or auxiliary plasma source to aid in the stabilization of the ICP during pulsing.

Further, the new ALET process presents a potential means for obviating the traditional ALET rate limiting steps, in a non-limiting example, gas pulsing. In some embodiments, the new ALET process method may comprise two stages: adsorption stage and etching stage. In some instances, the process may utilize switchable electrical pulses to the ICP source and electrodes positioned in the reaction chamber to control the chemisorption and etching. For example, the electrodes may apply bias voltages in the plasma in an approximately synchronous manner with the plasma pulses. Differential control of the plasma pulses and electrode bias voltages may permit fine control of the ion energy distribution impingent upon the substrate. In further instances, the new ALET process uses reduced amounts of process and reactant gases, which may be understood to be toxic and corrosive. Compared to the traditional etching methods, this provides reduced costs for gases, improved safety, and improving environmental implications for the process.

Figure 2:
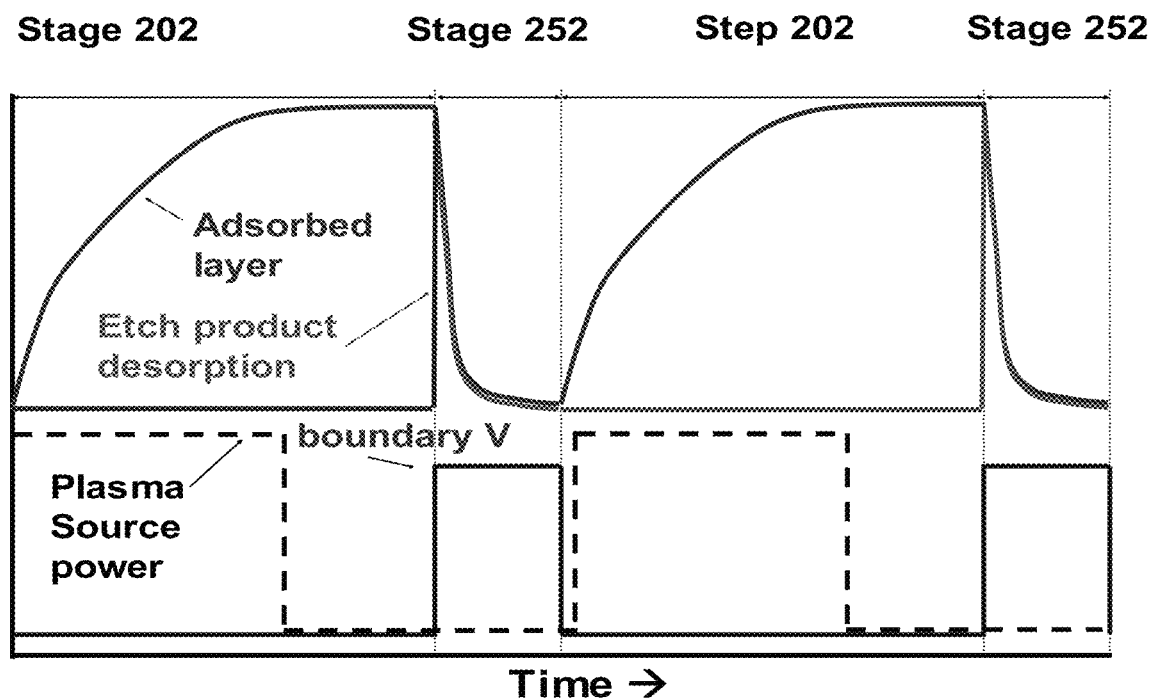
FIG. 2 illustrates an exemplary ALET process according to one embodiment of the present disclosure.

Novel ALET Process:

Referring to FIG. 2, there is shown ALET process 200 according to an embodiment of the present disclosure. The top portion of the figure illustrates ALET process, whereas the bottom portion of the figure illustrates the process parameter. As illustrated in the figure, ALET process comprises two stages: adsorption stage 212 and etching stage 252. During the adsorption stage 212, a substrate may be exposed to adsorbate such that the adsorbate may adsorb onto the surface of the substrate. In some embodiments, the adsorbate may be a reactant. In instances, the adsorbate may comprise dissociated reactant atoms or dissociated reactant molecules having unpaired electrons or dangling bonds. The reactant may comprise, without limitation, halogens, fluorine (F), chlorine (Cl), bromine (Br), or iodine (I). In certain embodiments, the reactant may be disassociated chlorine (Cl) atoms that are derived from chlorine reactant gas ($Cl_2$). Without limitation by theory, a skilled artisan may recognize that other halogens, halogenated species, or other reactants may also be used in the adsorbate. In alternate embodiments, the intact or un-dissociated reactant may also be used as the adsorbate on the substrate. Further, a skilled artisan may recognize that the term "gas" includes vapor generated from a substance in solid or liquid state at room temperature or at standard temperature and pressure, without limitation.

The adsorbate may be obtained by generating plasma containing the reactants. In certain instances, inert gas may be ionized along with the reactant. Without limitation, the resulting plasma may contain reactants, reactant gas ions, and inert gas ions. In embodiments, argon (Ar) is used as the inert gas. Additionally, a skilled artisan will recognize that any noble gas species or other inert gas species may also be used.

In embodiments, if the reactant is ionized with the inert gas, the concentration of the reactant gas, may be between about 0.01% and about 20% by volume; alternatively, the reactant gas concentration may be between about 0.01% and about 15%; and in certain instances, the reactant gas concentration may be between about 0.01% and about 10% by volume of the combined gas. In certain embodiments, the reactant gas may comprise a concentration of less than about 1% by volume. Without limitation, the plasma generated may primarily comprise Ar species and a small portion of Cl reactant gas species.

In embodiments, the plasma source is used to generate the reactant. Non-limiting exemplary plasma sources may include, inductively coupled plasma (ICP) sources, capacitively coupled plasma (CCP) sources, or helicon sources. In certain embodiments, the plasma source is an ICP source. In instances, the ICP source may RF powered during the adsorption stage 212.

In embodiments, the plasma source is not powered through the entire adsorption stage 212. In instances, the RF power applied to the plasma source may be lowered during the latter portion of the adsorption stage 212. In non-limiting examples, the plasma source may be RF powered during the beginning portion of the adsorption stage 212, as illustrated in FIG. 2. Further, during the latter portion of the stage 212, lower power may be applied to the plasma source, or the plasma source may be turned OFF to provide afterglow. Alternatively, the plasma source may be powered continuously throughout the entire adsorption stage 212.

Without limitation by theory, the adsorption process may occur as described herein. A substrate comprising a clean surface, without a passivating layer may include unpaired electron or dangling bonds. In instances, reactants from the plasma near the substrate surface may then easily bond with the dangling bonds of the surface, such as through chemisorption, to form a product layer. In instances, the product layer may comprise a monolayer of the reactants and a monolayer of the substrate atoms that are associated. In instances, the Cl reactants are adsorbed onto the surface of an exemplary silicon (Si) substrate to form a product layer comprising $SiCl_x$. Further, in certain instances, the product layer may comprise a monolayer of reactant species Cl atoms and a monolayer of Si atoms. Adsorption may continue until the substrate surface is saturated with the reactants. Without limitation, saturation is achieved when substantially all available substrate surface-sites, such as unpaired electrons or dangling bonds, are occupied or associated with the reactants. As may be understood by a skilled artisan, in certain instances a portion of the substrate surface is not covered with the reactants. For example, a portion of the substrate surface may contain a passivating layer, such as but not limited to an oxide layer. In non-limiting examples, the passivating layer may not contain available sites, available unpaired electrons or dangling bonds, and as such is not covered with the reactants. In certain instances, the substrate surface is at least partially covered with chemisorbed reactants in the product layer and at least partially covered with a passivating layer.

In embodiments, during the adsorption stage 212, the reactant gas ions and/or inert gas ions may be present in the plasma, such that the substrate surface comprising a product layer is exposed to the ions. In instances, the energy of the ions bombarding the substrate may be selectively controlled to avoid or minimize undesired etching, physical or chemical sputtering. For example, the energy required by Cl ions to etch Si may be about 10-25 eV, whereas the energy required by Ar ions to cause sputtering may be about 30-60 eV. In certain embodiments, the energy of the ions bombarding the substrate during the adsorption stage 212 may be controlled to be about 10 eV or less. The ion energy may be controlled by, for example, providing an electrostatic shielding (e.g. Faraday shield) of the plasma source and/or per-forming the process under relatively high pressure in order to minimize undesired etching, physical or chemical sputtering. Moreover, Cl reactant atoms do not etch p-type or moderately doped n-type Si at room temperature, requiring thermal control of the process.

In embodiments, after completion of the adsorption stage 212, the etching stage 252 may be performed. During this etching stage 252, ions may bombard the substrate to remove the product layer. In certain embodiments, the ions comprise positively charged ions or negatively charged ions. In instances, positively charged ions are used to remove the product layer. As understood by a skilled artisan, the energy of the ions bombarding the substrate during the etching stage 252 may preferably be above the threshold for chemically-assisted sputtering but below the threshold for physical sputtering. The ions with selected energy may be directed toward the substrate by controlling the potential difference between the plasma and the substrate. To direct positive ions toward the substrate, the potential difference between may be increased by increasing the plasma potential relative to the substrate potential, decreasing the substrate potential relative to the plasma, or both. To direct negative ions, the potential difference between may be increased by decreasing the plasma potential relative to the substrate potential, increasing the substrate potential relative to the plasma, or both. Positive or negative, DC or RF bias may be applied to the plasma and/or the substrate during the etching stage 252. In addition, continuous bias may be provided to the plasma and/or the substrate as shown in FIG. 2. Alternatively, a series of pulsed bias may be provided as shown in FIG. 4.

Figure 4:
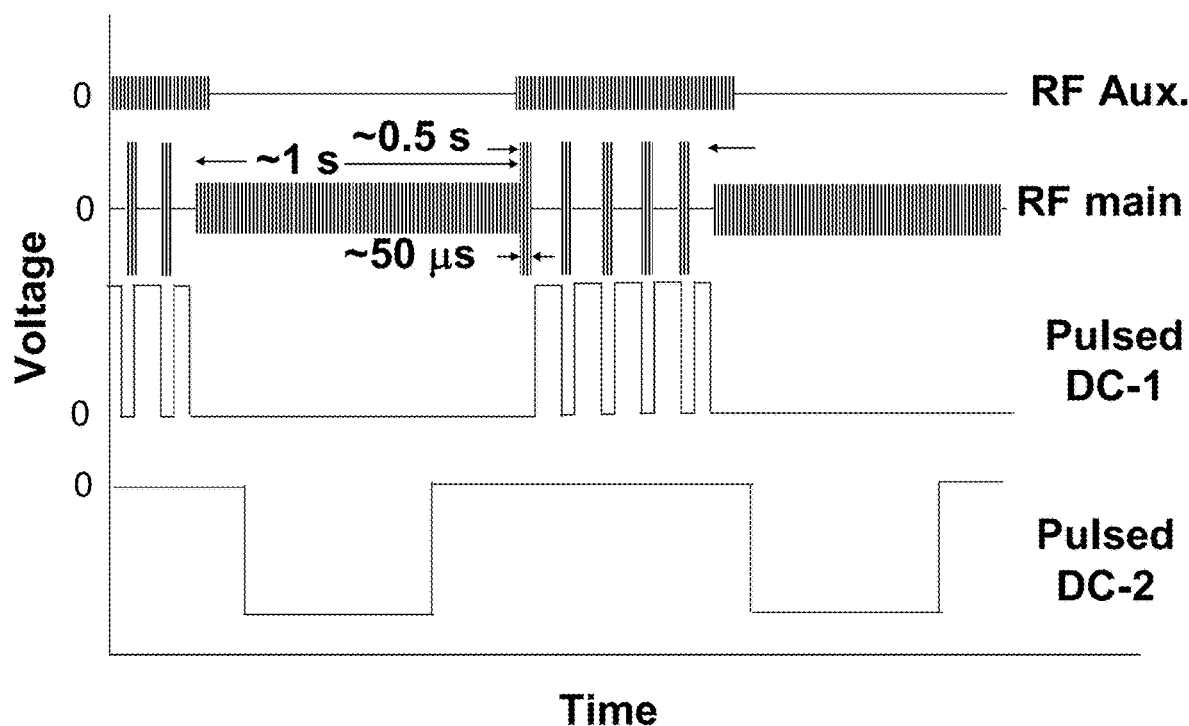
FIG. 4 illustrates another exemplary ALET process according to another embodiment of the disclosure.

In certain embodiments, the plasma source may be RF powered during the etching stage 252, as shown in FIG. 4. In instances, the plasma source may be provided with pulsed RF power, where each RF power pulse is provided between the bias pulses noted above. For example, a series of pulsed RF power may be applied to the plasma source during the etching stage 252 and a series of pulsed DC or RF bias may be applied to the plasma and/or the substrate. Each bias pulse may be provided between the RF power pulses. Alternatively, the bias pulse is between about 1 µs and about 20 µs; alternatively about 10 µs into the afterglow of each plasma source pulse.

In instances, by selectively increasing the potential difference between the plasma and the substrate, the product layer comprising the chlorinated product layer in the certain embodiment described here, may be removed. In the process, the monolayer of the substrate atoms associated with the product may be removed from the substrate concurrently. Additionally, the adsorption stage 212 and the etching stage 252 may be repeated to remove additional layers of the substrate atoms one layer at a time.

Figure 3:
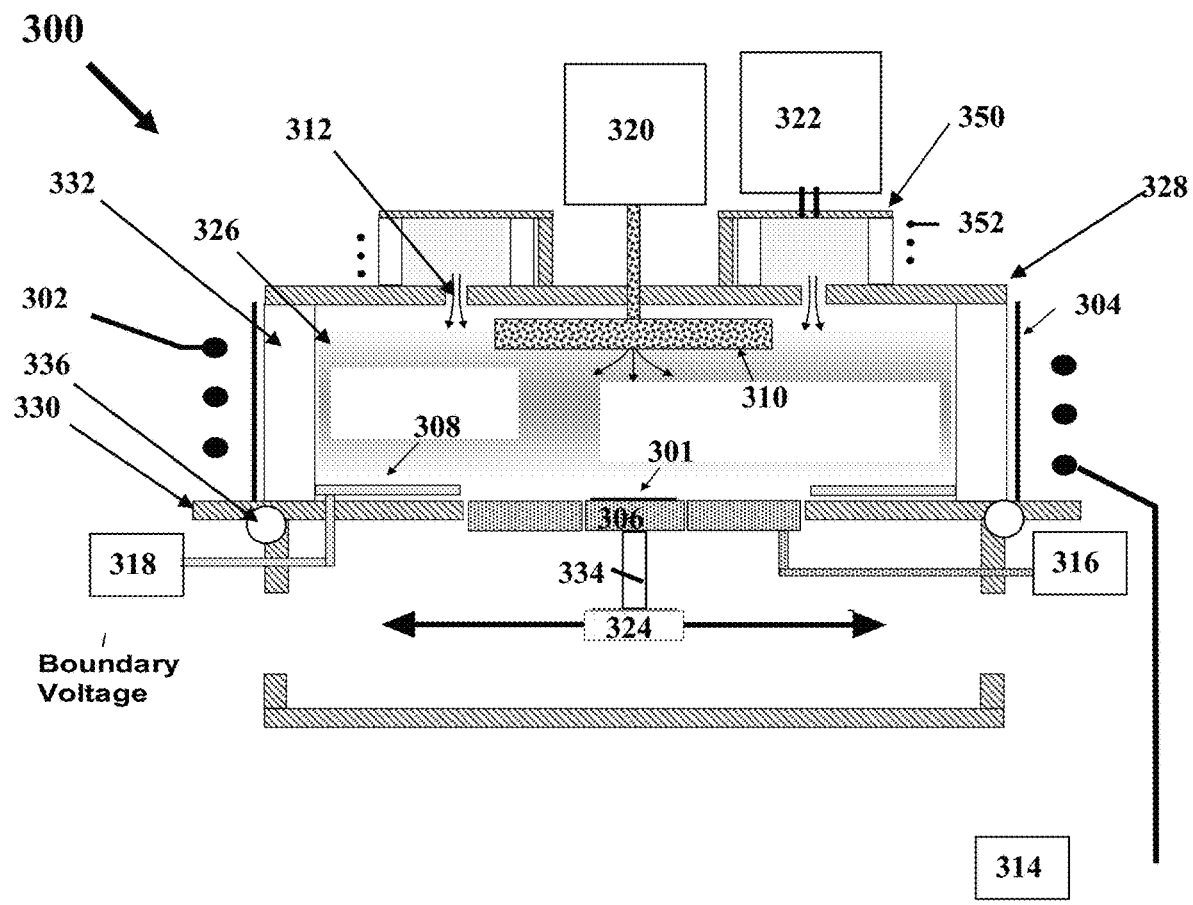
FIG. 3 illustrates an exemplary ALET system according to one embodiment of the disclosure.

Novel ALET System:

Referring now to FIG. 3, there is shown an exemplary ALET system 300 according to one embodiment of the present disclosure. ALET system 300 according to one embodiment of the present disclosure may comprise a plasma chamber 326 having top wall 328, bottom wall 330, and side wall 332. ALET system 300 may also comprise a plasma source 302, a shield 304 interposed between the plasma chamber 326 and the plasma source 302, a substrate support 306, a boundary electrode 308, a counter-electrode 310, and an inlet 312. The plasma source 302 may be coupled to a pulsing system 314. The substrate support 306, meanwhile, may be coupled to a support system 316. The support system 316 may be a power supply capable of providing continuous or pulsed DC or RF bias to the substrate support 306. Alternatively, the support system 316 may simply be a ground or a component connected to ground. The boundary electrode 308 may be coupled to a first voltage system 318. The counter-electrode 310 may be coupled to a second voltage system 320.

In embodiments, the ALET system may additionally comprise a pump 324 coupled to the plasma chamber 326. In certain configurations of ALET system 300, at least one cooling conduit 336 may be included. In other configurations, the substrate support 306 may comprise a differential pumping conduit 334. In alternate configurations, the plasma chamber top 328 may comprise a counter-electrode 310 and the gas inlet 312. In further alternate configurations, the system 300 may further comprise an auxiliary plasma chamber 350 coupled to the plasma chamber 326. An auxiliary plasma source 352 may be disposed near the auxiliary plasma chamber 350.

In embodiments, the plasma source 302 and the auxiliary plasma source 352 may be any type of plasma source known to those skilled in the art, including an ICP source, CCP source, helicon source and heat source, without limitation. In certain embodiments, the plasma source 302 may be ICP source 302. ICP source 302 may be a planar or a cylindrical ICP source 302 comprising a planar or helical coil. Alternatively, the ICP source may have other geometry. The portion of the plasma chamber 326 and/or the auxiliary chamber 350 adjacent to the plasma source 302 and/or the auxiliary plasma source 352 may be made out of dielectric material such as, for example, quartz or alumina. For example, at least a portion of the plasma chamber 326 and the auxiliary plasma chamber 350 or entire the plasma chamber 326 and the auxiliary plasma chamber 350 may be made out of dielectric material. In certain instances, the ICP source 302 comprises a spiral coil electrode disposed around an alumina or other dielectric discharge tube. In further instances, the ICP source comprises a three-coil spiral electrode.

The shield 304 may comprise a Faraday shield. In embodiments, the Faraday shield comprises any conducting material suitable for preventing external interference with the ICP source 302. In instances, the shield 304 may comprise copper. In certain instances, the shield 304 may be configured to prevent capacitive coupling between the coil of the ICP source 302 and the plasma it generates. Alternatively, the shield 304 is configured to prevent any electrostatic signals from exiting the plasma chamber 326.

The substrate support 306 comprises a support for a semiconductor during etching. In embodiments, the substrate support 306 comprises an electrode. In some instances, the substrate support 306 is a ground electrode. In certain instances, the substrate support 306 comprises a bias electrode, configured to generate and maintain a bias voltage in response to an RF electromagnetic-field or direct current (DC) pulsing. In further embodiments, the substrate support 306 enters the plasma chamber 326 via the bottom 330 of the plasma chamber 326. In instances, the substrate support 306 supports the substrate 301 at or in proximity to the bottom 330 of the plasma chamber 326.

The boundary electrode 308 comprises an electric conducting material disposed proximal to the substrate support 306. In some embodiments, the boundary electrode 306 may be disposed concentrically around the substrate support 306 near the bottom 330 of the plasma chamber 326. In instances, the boundary electrode 308 is configured to apply bias in response to an RF or DC signal applied to the plasma source 302, the auxiliary plasma source 352, and/or the counter electrode 302.

The counter-electrode 310 may comprise an electrical conducting material disposed vertically opposite from the substrate support 306. In embodiments, the counter-electrode 310 is disposed opposite from the boundary electrode 308 in the chamber 326. In some instances, the counter-electrode 310 is applied with a bias voltage in response to a RF or DC signal applied to the plasma source 302, the auxiliary plasma source 352, and the boundary electrode 308. In certain instances, the counter-electrode 310 generates a bias voltage or a pulsed bias voltage that is opposite to the bias voltage of the boundary electrode 308.

The inlet 312 comprises a gas conduit into the chamber 326. In embodiments, the inlet 312 is proximal to the top of the chamber 326 or through the top 328 or the chamber 326. Without limitation, the inlet 312 may introduce inert gas and reactant gas into the plasma chamber 326. In instances, the inlet 312 provides heated gases to the chamber 326 and the plasma source 302. In certain instances, the inlet 312 may introduce non-ionized process and reactant gases to the chamber 326 and the plasma source 302. Alternatively, the inlet 312 is in communication with at least one auxiliary plasma source 352, for introducing at least partially ionized process and reactant gases to chamber 326 and the plasma source 302.

The plasma source 302 may be coupled to a pulsing system 314. In embodiments, the pulsing system 314 comprises at least one power supply capable of providing pulsed or continuous RF and/or DC signal to the plasma source 302. In some instances, the pulsing system 314 may comprise at least one RF or DC power supply and an electric power amplifier. In some other instances, the pulsing system 314 may comprise a plurality of RF or DC power supply and power amplifiers. The pulsing system 314 may be coupled to the plasma source 302 via an impedance-matching (e.g. L-type) network. The pulsing system 314 is further configurable to provide electrical power at any frequency to plasma source 302. In instances, the pulsing system 314 is configured to cut or remove power from the plasma source 302 in periodic pulses. In certain instances, the RF or DC power supply may provide the plasma source 302 with a square wave function between zero volts and a predetermined high voltage and at a predetermined frequency. As may be understood by those skilled in the art, removing or altering the RF electric current through the coil removes or enhances the formation of plasma.

The substrate support 306 is coupled to a support system 316. In embodiments, the support system 316 comprises an electric circuit including substrate support 306. In instances, the support system 316 is a grounded electrode. In certain instances, the support system 316 comprises an RF function generator or a DC source. The support system 316 is configured for producing a bias voltage at the substrate support 306 in response to electrical pulses from the RF function generator or a DC source. In certain configurations, the support system 316 receives an RF or DC current from the pulsing system 314 as the bias voltage at substrate support 305. Further, the bias voltage of the substrate support 306 may be pulsed in coordination with other electrodes in the system 300.

The boundary electrode 308 is coupled to a first voltage system 318. In embodiments, the first voltage system 318 comprises an electric circuit including the boundary electrode 308. In instances, the first voltage system 318 is an electric ground, a RF function generator, or a DC source. In certain instances, the first voltage system 318 is configured for producing a bias voltage at the boundary electrode 308 in response to DC source. In certain configurations, the first voltage system 318 receives an RF or DC current from the pulsing system 314, as the bias voltage at the boundary electrode 308. Further, the bias voltage of the boundary electrode 308 may be pulsed in coordination with other electrodes in the system 300.

The counter-electrode 310 is coupled to a second voltage system 320. In embodiments, the second voltage system 320 comprises an electric circuit including the counter-electrode 310. In instances, the second voltage system 320 is an electric ground, an RF function generator, or a DC source. In certain instances, the second voltage system 320 is configured for producing a bias voltage at the counter-electrode 310 in response to DC source. In certain configurations, the second voltage system 320 receives an RF or DC current from the pulsing system 314, as the bias voltage at the counter-electrode 310. Further, the bias voltage of the counter-electrode 310 may be pulsed in coordination with other electrodes in the system 300.

The gas inlet 312 is fluidly connected to a gas source 322. In embodiments, the gas source 322 comprises process gas and reactant gas mixture for introduction to the plasma source 302. In instances, the process gas comprises any inert gas that will be ionized to form plasma at the plasma source 302. In certain instances, the process gas comprises a noble gas, nitrogen, hydrogen, oxygen, oxygenated gases, or combinations thereof without limitation. The reactant gas comprises any gas that will be chemisorbed by the substrate 301 after partial ionization at the plasma source 302. In certain instances, the reactant gas comprises a halogen, a halocarbon, a halide, or other halogenated gases without limitation. In further instances, the process gas and the reactant gas may be any gases suitable for ALET. In embodiments, the gas source comprises a concentration of the process gas of greater than about 90% by volume; alternatively, greater than about 95% by volume; and in certain instances, the gas source has a concentration of process gas that is greater then about 99% by volume.

The thermal conduit 336 is configured to alter the temperature of the gas in the system. In embodiments, the cooling conduit may be any conduit in thermal contact with the system 300 and configured for carrying a cooling liquid or gas. In instances, the cooling conduit 336 is in thermal communication with the cylindrical wall 332, and the shield 304. In embodiments, the cooling conduit 336 is disposed in thermal communication with a flange such as chamber bottom 330, which couples the cylindrical wall 332 and the shield 304.

The pump 324 may be any pump configured to reduce gas pressure in a reaction chamber 326 to about 1 mTorr. In embodiments the pump 324 is configured to lower and maintain the pressure in the plasma chamber 326 to between about 1 mTorr and about 500 mTorr; alternatively between about 5 mTorr and about 250 mTorr; and alternatively, between about 10 mTorr and about 100 mTorr. In certain instances, the pump 324 operates a pressure between about 10 mTorr and about 75 mTorr in the chamber 326. In instances, the pump 324 comprises at least one vacuum pump. In embodiments, the pump 324 comprises a turbo vacuum pump and a dry pump. Without limitation by theory, the pump 324 may be configured to operate within any range of pressures in order to evacuate the chamber of ionized gases, etched products, and other gaseous contaminants.

Alternate ALET Process:

Referring again to FIG. 4, there is shown an alternate exemplary method for controlling the ALET process according to another embodiment of the present disclosure. FIG. 4 illustrates the timing sequence of RF/DC power/voltage signals applied various components of the ALET system shown for example in FIG. 3. In embodiments, the signals may be used to control plasma physics and chemistry during ALET process.

Referring briefly to FIG. 3, the plasma source 302 is applied with RF power for approximately 1 second during the etching stage, as in stage 202 in FIG. 2, to provide reactants (e.g., Cl atoms), to form a chemisorbed layer. In embodiments, the plasma source is applied with RF power throughout the entire adsorption stage. As described herein previously, the plasma may source may be applied with RF power during the beginning portion of the adsorption stage and powered down during the latter portion of the stage. In certain embodiments, the plasma in the plasma chamber 326 may be ignited by the tail-end of a low-power, auxiliary plasma generated in the auxiliary plasma chamber 350. During ignition of the plasma, the ion bombardment energy may be sufficiently low (<10 eV) to prevent any etching to occur. During the etching stage, as in stage 252 in FIG. 2, a pulsed ICP period of approximately 0.5 s removes the chemisorbed layer (e.g. $SiCl_x$). Pulsing the plasma source power, as a square wave modulation of 13.56 MHz applied RF voltage, has several benefits described hereinafter.

Figure 7:
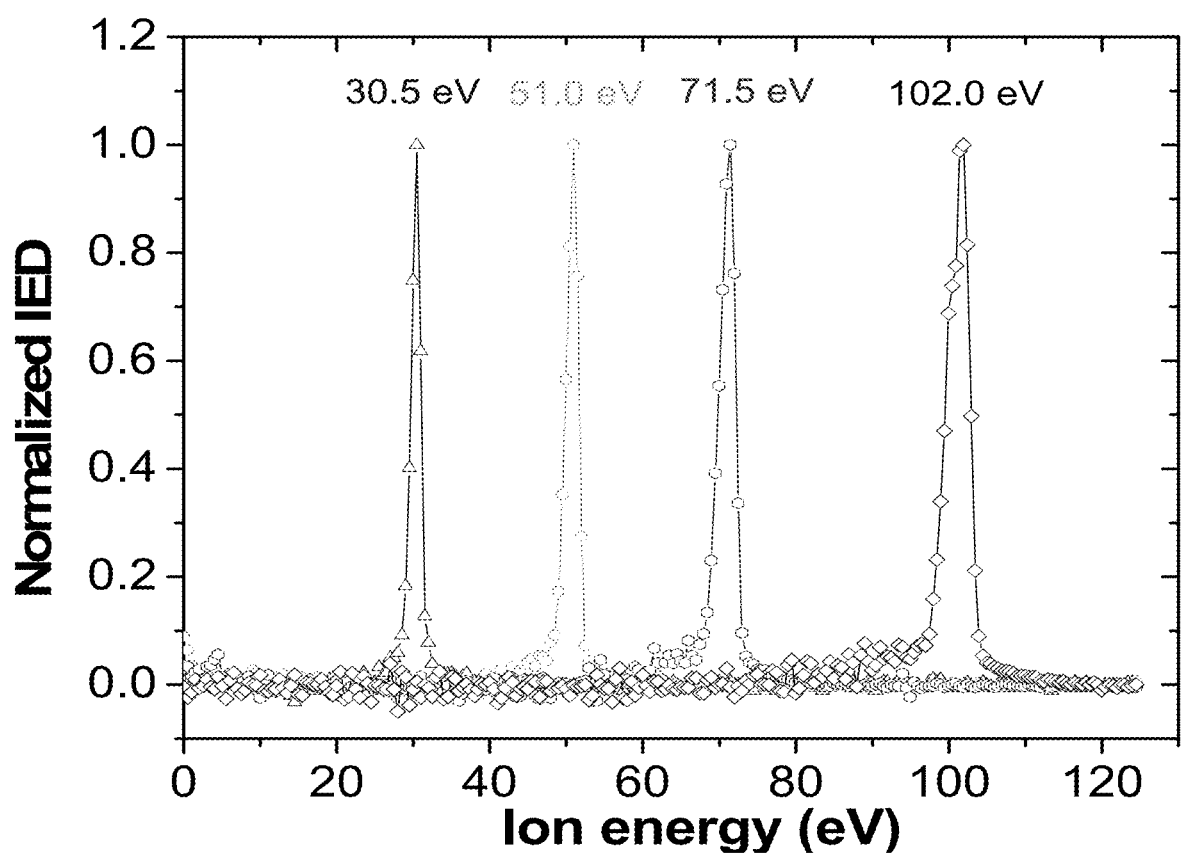
FIG. 7 illustrates measured ion energy distributions (IED) obtained by applying DC voltages of 30, 50, 70 and 100 V to a boundary electrode in the afterglow of a pulsed plasma.
Figure 8:
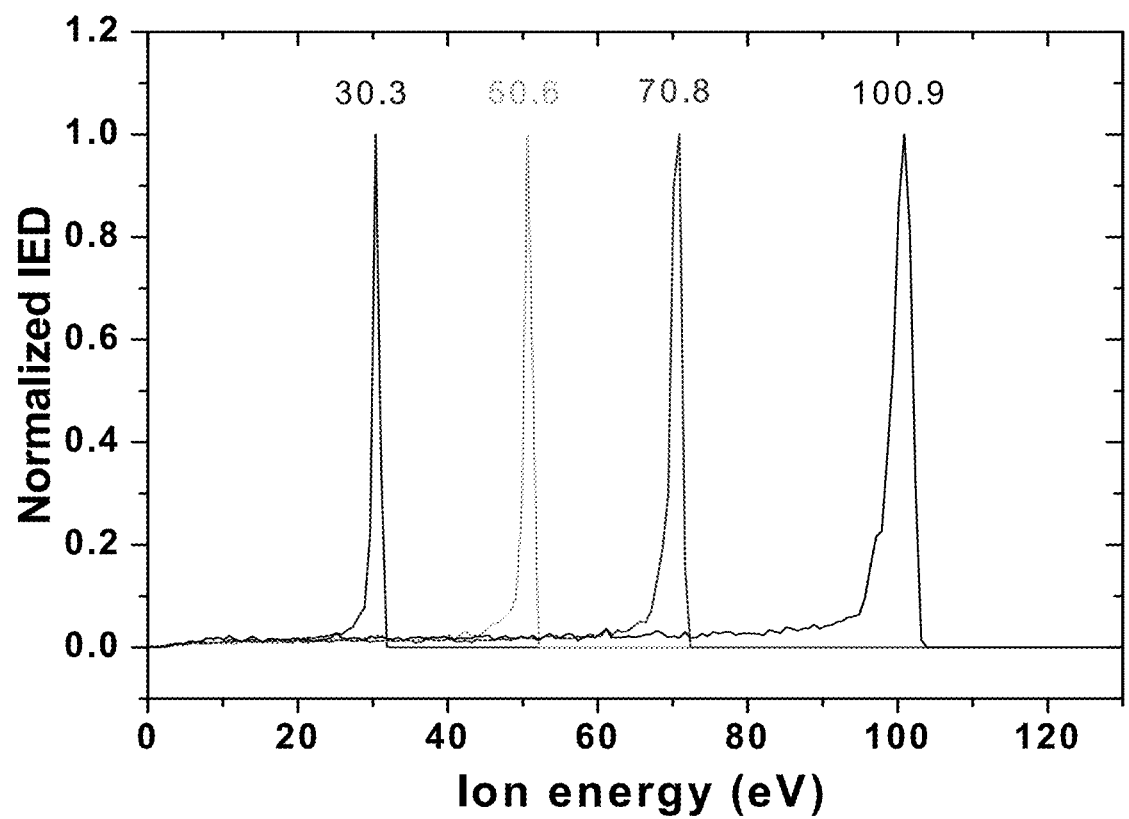
FIG. 8 illustrates simulated ion energy distributions (IED) obtained by applying DC voltages of 30, 50, 70 and 100 V to a boundary electrode in the afterglow period of a pulsed plasma.

First, the electron energy distribution function (EEDF) cools rapidly during the first several μs of the power OFF portions of the cycle in the afterglow, without a substantial loss of plasma density, for example over a typical about 100 μs OFF time. The resulting lower energy time-averaged EEDF offers some level of control of the degree of dissociation of the feed gases. Second, during most of the about 100 μs afterglow period, a mono-energetic ion flux to the substrate can be generated, as recently demonstrated in this laboratory. In this example, a pulse of positive DC voltage may be applied to the boundary electrode, raising the plasma potential and pushing positive ions toward the surfaces substrate with lower potential. Thus, a grounded substrate is bombarded with ions with energy equal to $V_{Dc1}$, as shown in FIGS. 7 and 8. Since control of the ion energy distribution is critical to effect chemical sputtering of the chemisorbed halogenated layer, without physical sputtering of the underlying substrate, this method of obtaining extremely narrow IEDs, and thus extreme selectivity, is an effective means to achieve ALET with monolayer accuracy. This pulsed-main-ICP with synchronous pulsed-immersed-electrode-bias-voltage period is long enough (e.g., 0.5 seconds) to sputter away the halogenated etch product layer. However, those of ordinary skill in the art with recognize that negative DC or RF voltage may be applied to the substrate, for example, via the substrate support. In the process, the substrate potential may be lowered to attract the positive ions.

Net positive ion bombardment can cause a positive charge to build up on the substrate. However, after the boundary voltage pulse returns to zero, and the plasma has had a chance to approach its natural $V_P$, any charged surfaces with potentials above ground are the first to receive an excess electron flux over the positive ion flux, bringing their potential back to the floating potential, which is near ground potential. To accelerate positive charge neutralization, a large negative DC bias may be applied to, for example, the counter-electrode 310, while a continuous wave ICP power is ON. This negative voltage may have no effect on $V_P$. However, the resulting high energy ion bombardment of the counter-electrode 310 may generate secondary electrons that are accelerated to the full sheath potential. These high energy "ballistic" electrons may have a low scattering cross section and bombard the substrate at nearly normal incidence, compensating positive charge at the bottom of even high aspect ratio insulating structures. The ballistic electrons can also have beneficial effects on the bulk plasma, such as the enhanced plasma density and lower bulk $T_e$.

Alternatively, for insulating substrates, application of synchronous pulsed RF voltage to the substrate electrode in the afterglow period would result in a negative self-bias, and energetic positive ion bombardment of the substrate. Depending on plasma density and applied frequency, ion energies on a RF biased substrate 301 can be peaked at the average sheath potential or double peaked. The resulting ion energy distributions are normally too wide to achieve the extreme selectivity required by ALET. Application of very high frequency (100 MHz) bias can narrow the IEDs, but the width of the IED depends on ion mass, making IED control very difficult in mixed gas plasmas. Narrow ion energy distributions could possibly be obtained with tailored bias pulses. For conducting substrates, synchronous pulsed DC negative bias can be applied directly on the substrate support electrode during the afterglow, and nearly mono-energetic ion bombardment can be achieved at any desired energy, the same way as in the case of the boundary voltage described above.

Figure 5:
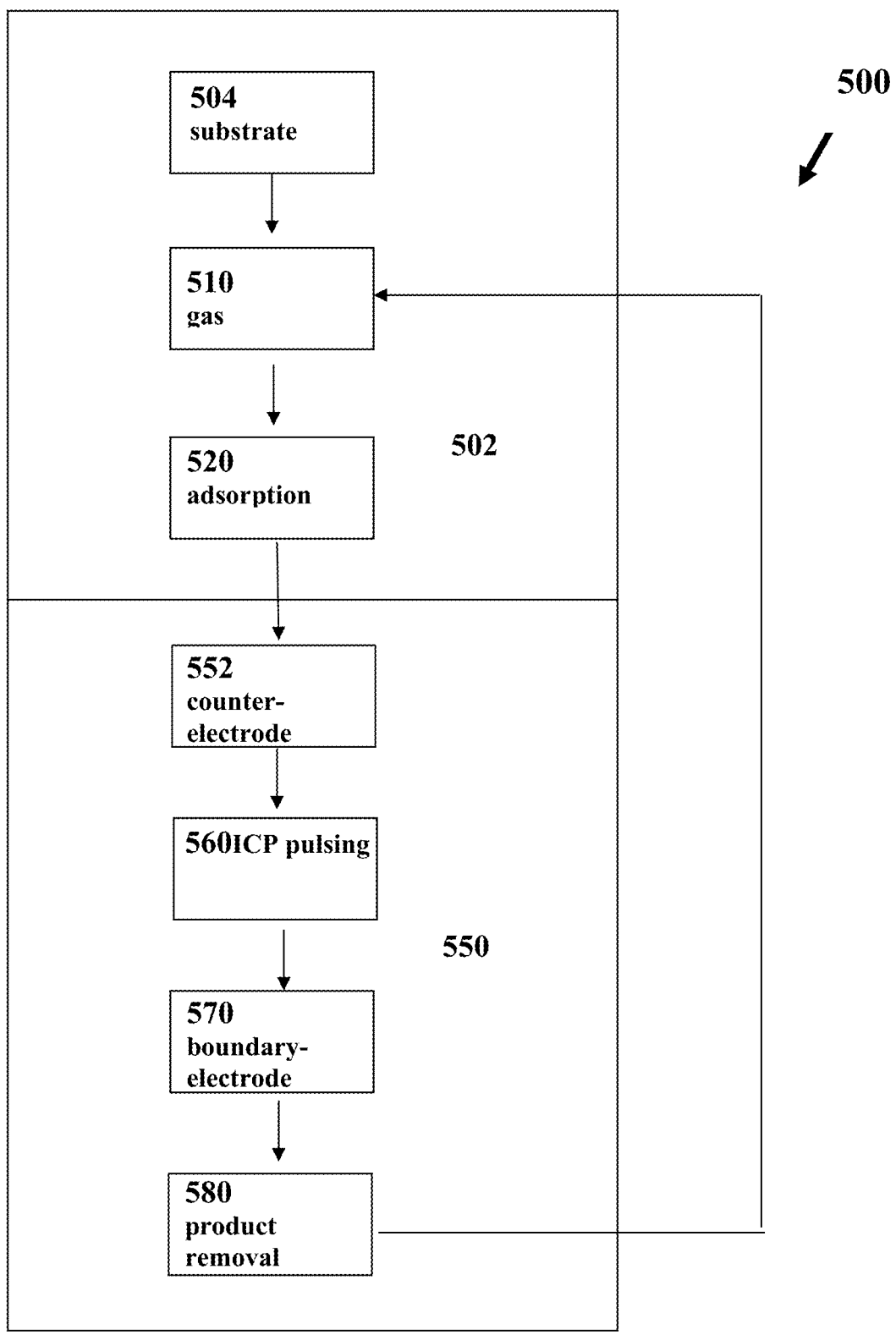
FIG. 5 illustrates another exemplary ALET process according to another embodiment of the present disclosure.

Referring now to FIG. 5, a process flow diagram of the ALET process is shown. As illustrated, the method 500 generally comprises two stages: adsorption stage 502 and etching stage 550. As may be understood, within each stage may comprise one or more steps or incremental steps that when conducted sequentially or synchronously accomplish the method 500. In other words, although FIG. 5 illustrates the steps being performed sequentially, the steps may be performed simultaneously, or at least some portions of the steps may be performed simultaneously. As illustrated in FIG. 5, the adsorption stage 502 may comprises substrate positioning step 504, reactants forming step 510, and reactant adsorption step 520. Meanwhile, the etching stage 550 may comprise a potential difference increasing step 570. As noted above, the potential difference between the plasma and the substrate may be increased by applying RF or DC voltage to the plasma or the substrate. Optionally, the etching stage 550 may also comprise substrate charge neutralization step 552, and plasma pulsing step 560, and etched product removing step 580. As noted above, charge neutralization step 552 may be performed by biasing the counter electrode. The present ALET process 500 may be considerably faster than conventional ALET process. More specifically, after the substrate positioning step 504, the remaining adsorption steps 520 may require a time between about 0.01 s and about 10 seconds; alternatively, between about 0.1 second and about 5 seconds; and in embodiments between about 0.5 second and about 1.5 seconds. Additionally, the etching stage 550 may require a time between about 0.01 second and about 10 seconds; alternatively, between about 0.1 second and about 5 seconds; and in embodiments between about 0.2 second and about 1 second. After the etch product removing step 580, the stages or steps may be repeated in entirety or partially until a desired etch depth is reached. In certain instances, charge neutralization step 552, and plasma source pulsing step 560, and the potential difference increasing step 570 may be performed simultaneously, or in the alternative, synchronously.

More specifically, the adsorption stage 502 may comprises the steps in the disclosed rapid ALET process suitable for adsorbing reactants on the substrate. The first step in the stage comprises the substrate positioning step 504 where the substrate is positioned in a chamber. In some embodiments, the substrate is mounted a substrate support. In certain instances, the substrate support may be an electrode.

When the substrate is positioned in the chamber, the pressure in the chamber may be reduced. In embodiments, the pressure, during the ALET process, is maintained between about 1 mTorr and about 500 mTorr; alternatively between about 5 mTorr and about 250 mTorr; and alternatively, between about 10 mTorr and about 100 mTorr. In certain instances, the pressure is maintained between about 10 mTorr and about 75 mTorr during the substrate positioning step 504 and maintained there throughout the entire ALET process. In further instances, the pressure may be altered to provide IED control at any time throughout the novel ALET Process. As may be understood by those skilled in the art increase in pressure in the reaction chamber may correlate to an increase in gas particles and radicals. Without being limited by theory, increased pressure may decrease the peak energy of ions and broaden the IED, and vice versa.

During the reactants forming step 510, feed gas may be introduced into the chamber. In some embodiments, the feed gas may comprise inert gas and reactant gas. Without limitation by theory, the reactant gas may comprise, a reactive species, when ionized. In the present embodiment, the reactant gas may comprise $Cl_2$. However, those skilled in the art may recognize that other reactant gas such as other halogen containing gas may also be used. Meanwhile, the inert gas may comprise Ar. However, those skilled in the art may recognize that other inert gas may also be used. In the present embodiment, the inert gas may have higher concentration by volume than the reactant gas. In some instances, the reactant gas may comprise a concentration by volume between about 0.01% and about 20%; alternatively, between about 0.01% and about 15%; and alternatively between about 0.01% and about 10% of the mixed gas. In alternate instances, the reactant gas may comprise a concentration anywhere greater than about 0% and below about 5% by volume of the mixed gases.

The feed gas containing the reactant gas and the inert gas may be ionized by the plasma source to form plasma containing, among others, reactants, reactant gas ions, and inert gas ions. As noted above, various types of plasma source may be used. In certain embodiments, the feed gas may be heated to a temperature of greater than about 200K; alternatively, to a temperature greater than about 400K. In certain instances, the gas stream is subjected to further RF electromagnetic fields. Components of this plasma including combinations of excited states of species, radicals, ions, electrons, and photons are injected in to the etching chamber. The partially ionized reactant gases are pulled directionally toward or away from the substrate in response to the charge bias within the chamber.

During the reactant adsorption step 520, the reactants are adsorbed or chemisorbed onto the surface of the substrate. In embodiments, a voltage bias within the chamber may attract the ionized reactant gases to the substrate. As the substrate has a limited number of surface sites to adsorb the reactants, such as unpaired electrons or dangling bonds. The reactants will continue to adsorb onto the substrate surface until the end of the adsorption stage, when all available surface sites or dangling bonds on the substrate are occupied with the reactants. As a result, a product layer comprising a monolayer of the reactant atoms and a monolayer of underlying substrate atoms may form. During the reactant adsorption step 520, the plasma and the ions are maintained at low energy (e.g. 10 eV or less) to avoid or minimize etching during the reactant adsorption step 520.

After completion of the adsorption stage 502, etching stage 550 may be performed. As noted above, the etching stage 550 may comprises the potential difference increasing step 570. During this step, the potential difference between the plasma and the substrate is increased such that ions from the plasma may bombard the substrate at a desired energy range. For example, the ion energy may be chosen that is below the physical sputtering threshold but above the threshold for chemically-assisted sputtering. As noted above, the potential difference may be increased by applying DC or RF voltage to the plasma, substrate, or both. In addition, the applied voltage may be continuous (as shown in FIG. 2) or pulsed (as shown in FIG. 4). If pulsed voltage is applied, RF pulses may be applied to the plasma source, between the voltage pulses. In some embodiments, applying RF pulses may comprise subjecting plasma source (e.g. ICP source) to a periodic square wave function, where the square wave extends from zero power to a pre-determined power. Without limitation by theory, the pre-determined high voltage is capable of creating ions with enough ionic energy to remove the product layer. In certain instances, ions with this energy establish the lower ionic energy limit for an IED. Conversely, it may be understood that the pre-determined high voltage is capable of creating ions with a lower ionic energy that does not damage the substrate. In certain instances, ions with this energy establish the upper ionic energy limit for an IED. More specifically, the high voltage pulsing for the ICP plasma is chosen during the plasma pulsing step 560 such that the IED falls entirely with these parameters.

During the optional plasma pulsing step 560, a square wave function may pulse the plasma for between about 1 microsecond and about 500 microseconds; alternatively between about 10 microseconds and about 250 microseconds; and in certain instances, the plasma is pulsed for between about 25 microseconds and about 100 microseconds. Further, the square wave function pulses the plasma to about zero voltage for between about 10 microseconds and about 750 microseconds; alternatively between about 50 microseconds and about 500 microseconds; and alternatively between about 100 microseconds and about 250 microseconds. When the plasma is pulsed to about zero power, an afterglow of ions remains. Without limitation by theory, the afterglow contains ions that are within the IED needed to remove the product layer.

Optionally, in the optional charge neutralization step 552, the counter-electrode may be applied with negative bias voltage. In some instances, the counter-electrode may be applied with negative voltages attract positively charged ions into the counter-electrode. The bombardment of the positively charged ions into the counter-electrode may generate high energy secondary electrons which may bombard the substrate at nearly normal incidence. In addition, the secondary electrons may enhance the plasma density and lower bulk electron temperature $T_e$.

Between the pulses applied to the plasma, the boundary electrode may be applied with positive voltage pulses. In certain instances, a square wave function DC pulses the boundary electrode to positively-charged voltage bias for between about 10 microseconds and about 750 microseconds; alternatively between about 50 microseconds and about 500 microseconds; and alternatively between about 100 microseconds and about 250 microseconds. In instances, the positively-charged voltage bias is present only when the high voltage plasma pulse is not. Alternatively, the positively-charged voltage bias is present for the complete duration of the etching the product layer 250.

In certain instances, the substrate support may be grounded, powered with RF, DC or a combination thereof. In embodiments, the substrate stage may be pulsed commensurate with the boundary electrode. Additionally, as certain substrates may have different conductivities, pulsing the substrate support bias provides additional means of controlling the IED as described previously for any electrode in the system. More specifically, the substrate support could be applied with negative DC voltage. Alternatively, a high frequency RF pulse or tailored DC pulse to the substrate support in the case of an insulating substrate or under other selected conditions.

ALET Pulsing:

As noted above, the optional plasma pulsing during the etching stage 550 provides the ability to control the disassociation of the feed gases and IED Providing the plasma pulsing during etching stage 550 may also reduce the angular distribution of ions impacting the substrate. Under collision-less conditions, the angular spread is given by Equation 1:

$$\theta_{IAD} \approx \text{Arctan}(\sqrt{T_e/2V}) \qquad \text{Eq. 1}$$

For a sheath voltage, $V=V_{sh}=50$ V and $T_e=0.3$ eV, the angular spread $\theta_{IAD}=3°$. This small angular spread, comparable to conventional plasma etching at much higher ion energies, is very desirable for obtaining consistent deep etching through multiple atomic layers, as well as minimizing ion energy transfer to the sidewalls of features from glancing angle collisions and sidewall damage.

It may be understood by a skilled artisan that all discussions of charge, ionization, electromagnetic potential are merely exemplary, and that any discussion of the state of matter in one embodiment is equally applicable to opposite states. More specifically, while some non-limiting examples describe the relationship between a negatively charged ion and an electrode, one of skill in the art will recognize that the interaction between a positively charged ion and an electrode would follow similar properties.

While preferred embodiments of the invention have been shown and described, modifications thereof can be made by one skilled in the art without departing from the spirit and teachings of the invention. The embodiments described herein are exemplary only, and are not intended to be limiting. Many variations and modifications of the invention disclosed herein are possible and are within the scope of the invention. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, and so forth). Use of the term "optionally" with respect to any element of a claim is intended to mean that the subject element is required, or alternatively, is not required. Both alternatives are intended to be within the scope of the claim. Use of broader terms such as comprises, includes, having, etc. should be understood to provide support for narrower terms such as consisting of, consisting essentially of, comprised substantially of, and the like. Accordingly, the scope of protection is not limited by the description set out above but is only limited by the claims which follow, that scope including all equivalents of the subject matter of the claims. Each and every claim is incorporated into the specification as an embodiment of the present invention. Thus, the claims are a further description and are an addition to the preferred embodiments of the present invention. The discussion of a reference in the Description of Related Art is not an admission that it is prior art to the present invention, especially any reference that may have a publication date after the priority date of this application. The disclosures of all patents, patent applications, and publications cited herein are hereby incorporated by reference, to the extent they provide exemplary, procedural or other details supplementary to those set forth herein.

To further illustrate various illustrative embodiments of the present invention, the following examples are provided:

EXAMPLES

Experimental Apparatus

Figure 6:
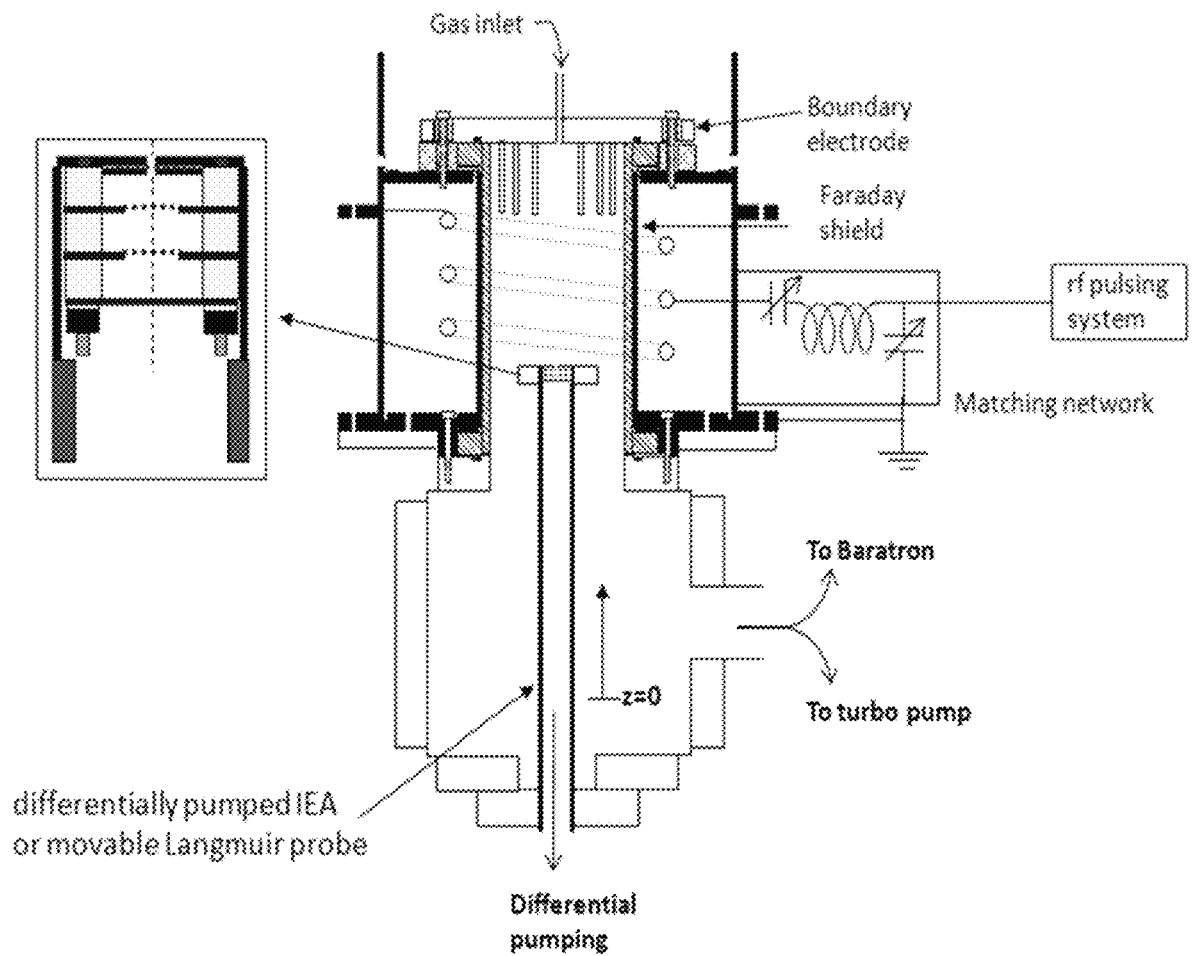
FIG. 6 illustrates another exemplary ALET system according to another embodiment of the disclosure.

FIGS. 3 and 6 show schematics of the experimental apparatus used in this study. The inductively coupled plasma (ICP) was ignited by a 3-turn spiral coil in a 17.8 cm long, 8.6 cm inside diameter alumina tube. A copper Faraday shield prevented capacitive coupling between the coil and the plasma. The discharge tube was connected to a cubical stainless steel (SS) chamber through an adaptor flange. A water channel in that flange served to cool the Faraday shield and prevent overheating of the discharge tube. The system was pumped by a 300 l/s turbo pump backed by a dry pump. Pressure was measured by a MKS 629 capacitance manometer mounted downstream of the plasma at 0.1 Torr full scale setting. A calibration experiment, without plasma, showed that the pressure at the discharge region was about 30-40% higher than that measured at the position of the pressure gauge. Pressures reported below are all calibrated values and refer to the plasma region.

A stainless steel electrode comprised the top electrode of the plasma source. The top electrode had three coaxial cylindrical SS rings welded to the electrode to increase the total surface area to about 300 cm$^2$ and minimize sputtered metal from coating the chamber. The large surface area was found to be necessary during Langmuir probe measurements when the probe was biased close to $V_P$. A large grounded surface was then required to supply an adequate electron current, preventing an artificial increase of $V_P$. Argon gas, with a high purity, 99.999% was fed into the discharge tube through a 1-mm diameter hole at the center of the top electrode. Plasma power at 13.56 MHz was supplied using a function generator (HEWLETT PACKARD® Model 3325A) feeding a power amplifier (ENI Model A-500). The output of the amplified was connected to the coil via an L-type matching network. Forward and reflected powers were monitored by in-line Bird meters placed before the matching network. For typical continuous wave (cw) 300 W Argon plasma at 14 mTorr, the reflected power was 1-2 W. The actual power dissipated in the plasma is somewhat lower than the net power delivered to the matching box due to power losses. For pulsed plasma operation, the RF pulse was amplitude-modulated by another function generator (BNC Model 645). Waveforms were monitored using a four-channel oscilloscope (TEKTRONIX® Model TDS 2024B). Base case conditions for pulsed plasma experiments were 120 W time-average forward power, 8 W reflected power, 10 kHz power modulation frequency, 20% duty cycle, 14 mTorr pressure, and 40 standard cubic centimeters per minute (sccm) argon gas flow rate. The applied modulation frequency and duty cycle resulted in 20 µs (microsecond) plasma ON (active glow) time and 80 µs plasma OFF (afterglow) time, during the 100 µs period of a pulse.

Experimental Operation Overview

FIGS. 2 and 4 show examples of a timing sequence that is used to control plasma physics and chemistry. First, an approximately is (second) continuous-wave main RF ICP is ignited by the tail-end of a low power auxiliary plasma, and provides reactants (e.g., Cl) to form a chemisorbed layer. During this time, the ion bombardment energy is too low (<10 eV) for any etching to occur. Next, a pulsed ICP period of typically ~0.5 s removes the chemisorbed layer (e.g. $SiCl_x$). Pulsing the main RF-ICP plasma source power (e.g., square wave modulation of 13.56 MHz applied RF voltage) has several benefits. First, the electron energy distribution function (EEDF) cools rapidly during the first several µs of the power OFF portions of the cycle (in the "afterglow"), without a substantial loss of plasma density (over a typical about 100 µs OFF time). The resulting lower energy time-averaged EEDF offers some level of control of the degree of dissociation of the feed gases. Second, during most of the about 100 µs afterglow period, a mono-energetic ion flux to the substrate can be generated, as recently demonstrated in this laboratory. In this example, a pulse of positive DC voltage is applied to the boundary electrode, raising the plasma potential and "pushing" positive ions to surfaces of lower potential. Thus, a grounded substrate is bombarded with ions with energy equal to $V_{DC1}$, as shown in FIGS. 7 and 8. Since control of the ion energy distribution is critical to effect chemical sputtering of the chemisorbed halogenated layer, without physical sputtering of the underlying substrate, this method of obtaining extremely narrow IEDs, and thus extreme selectivity, is an effective means to achieve ALET with monolayer accuracy. This pulsed-main-ICP with synchronous pulsed-immersed-electrode-bias-voltage period is long enough (e.g., 0.5 seconds) to sputter away the halogenated etch product layer.

Net positive ion bombardment can cause a positive charge to build up on insulating substrates. However, after the boundary voltage pulse returns to zero, and the plasma has had a chance to approach its natural $V_P$, any charged surfaces with potentials above ground are the first to receive an excess electron flux over the positive ion flux, bringing their potential back to the floating potential, which is near ground potential. To accelerate positive charge neutralization, a large negative DC bias may be applied to the counter-electrode, while a continuous wave ICP power is ON, as in FIGS. 3, 5, and 6. This negative voltage has no effect on $V_P$. However, the resulting high energy ion bombardment of the counter-electrode generates secondary electrons that are accelerated to the full sheath potential. These high energy "ballistic" electrons have a low scattering cross section and bombard the substrate at nearly normal incidence, compensating positive charge at the bottom of even high aspect ratio insulating structures. The ballistic electrons can also have beneficial effects on the bulk plasma, such as the enhanced plasma density and lower bulk $T_e$.

Alternatively, for insulating substrates, application of synchronous pulsed RF voltage to the substrate electrode in the afterglow period would result in a negative self-bias, and energetic positive ion bombardment of the substrate. Depending on plasma density and applied frequency, ion energies on a RF biased substrate can be peaked at the average sheath potential or double peaked. The resulting ion energy distributions are normally too wide to achieve the extreme selectivity required by ALET. Application of very high frequency (100 MHz) bias can narrow the IEDs, but the width of the IED depends on ion mass, making IED control very difficult in mixed gas plasmas. Narrow ion energy distributions could possibly be obtained with tailored bias pulses. For conducting substrates, synchronous pulsed DC negative bias can be applied directly on the substrate support electrode during the afterglow, and nearly mono-energetic ion bombardment can be achieved at any desired energy, the same way as in the case of the boundary voltage described above.

The ALET steps in the simplest configuration are illustrated in an example in FIG. 2, using Si etching with $Cl_2$ in Ar (argon) as an example. In Step 1 (lasting typically one second), the sample is exposed to a continuous-wave RF inductively-coupled plasma with the substrate at ground potential. The plasma is mostly inert gas with a very small amount (<1%) of $Cl_2$. With electrostatic shielding of the inductive source and a relatively high pressure, the energy of ions impacting the substrate would be less than the chemical sputtering threshold, so no etching would occur during step 1. The Cl atoms do not etch p-type or moderately doped n-type Si at room temperature. Cl atoms from dissociation of $Cl_2$ in the feed gas would allow a saturated layer of chlorinated products (e.g., SiCl for Si etching) to form in about one second.

In step 2, lasting about 0.5 s, a pulsed main ICP would be used and positive DC bias pulses would be applied synchronously to the boundary electrode about 10 µs into the afterglow of each main ICP pulse, to chemically sputter the product layer. Alternatively, the bias in Step 2 could be a negative DC voltage applied to the (conducting) substrate electrode or a high frequency RF pulse or tailored pulse to the (insulating) substrate electrode under selected conditions. This step would be monitored by optical emission from etch products, providing fundamental information on chemical sputtering yields and a means of controlling the process. An etching rate of one monolayer in one to several seconds, i.e. quite practical for nanometer scale structures in future devices and much faster than conventional atomic layer etching based on pulsed gas and purge schemes.

During the etching step, ion energy is chosen that is below the physical sputtering threshold but above the threshold for chemically-assisted sputtering. This regime provides very high selectivity combined with minimum damage, since etching would stop (self-limiting) after the chemisorbed layer of etch products is chemically sputtered away. Threshold values for Si are typically 10-25 eV under a variety of conditions.

Langmuir Probe:

A Langmuir probe (Smart Probe, Scientific Systems) was used to measure ion and electron densities (ni and ne), plasma potentials (VP), floating potentials, and electron energy probability functions (EEPF). The probe tip had a diameter of 0.19 mm and an exposed length of 40 mm. A compensation electrode and RF chokes minimized distortion of the current-voltage (I-V) characteristic due to oscillations of the plasma potential. This was not an issue in the present system where, due to the Faraday shield, peak-to-peak plasma potential oscillations were only 1-2 volts. The probe was movable along the discharge tube axis to obtain spatially resolved measurements. Fast data acquisition electronics enabled averaging of 100s of I-V characteristics (at a given location and for given plasma conditions) to reduce noise. The current-voltage (I-V) characteristics were interpreted using the software supplied by the manufacturer. This analysis relies on Laframboise's orbital motion-limited (OML) theory for a collision-less sheath. In the ion current region of the I-V, at larger negative voltages on the probe, collisions in the sheath (especially at higher pressures), will cause the ion current to be attenuated. Hence the analysis will underestimate the ion number density in the plasma. Since positive ion densities were extracted from the ion saturation regime of the I-V characteristic by applying voltages in the range ~0 to −50V, the positive ion densities were increasingly underestimated at pressures of ~10 mTorr and above. The probe was also operated in a "boxcar" mode to measure time-resolved plasma characteristics during pulsed plasma operation.

Retarding Field Energy Analyzer:

A retarding field energy analyzer (RFEA) was constructed to measure the energy distribution of ions passing through a grid on the grounded substrate stage. The RFEA was made of a stack of three nickel grids and a stainless steel current collector plate spaced 3 mm apart, as shown in FIG. 6 insert. The top grid having 50% open with square holes 18 mm on a side, was attached to a grounded SS plate with a 0.3 mm pinhole in contact with the plasma. This grid prevented the plasma sheath from molding over the pinhole. The middle and bottom grids were each 85% open with square holes 293 □mm on a side. The middle grid was biased with −30 V to repel electrons from the plasma, while the bottom grid was biased with a saw-tooth ramp voltage and served as an energy discriminator to measure the ion energy distribution (IED) A current amplifier (KEITHLEY® model 427) was used to measure the ion current on the collector plate. A 20 Hz ramp voltage was applied to the discriminator grid using a pulse generator and a power amplifier (AVTECH AVR-3-PS-P-UHF and AV-112AH-PS). The experiment was controlled through a LabVIEW (NATIONAL INSTRUMENTS®) program. Noise was reduced by averaging 5000 I-V characteristics resulting in "smooth" IEDs. The RFEA was differentially pumped by a 210 l/s turbo pump to minimize ion-neutral collisions in the analyzer. The pressure in the analyzer was estimated to be two orders of magnitude lower than the pressure in the discharge tube, resulting in collision-less ion flow. The energy resolution of the RFEA was estimated using the formula: ~DE/E=2%.

Figure 9:
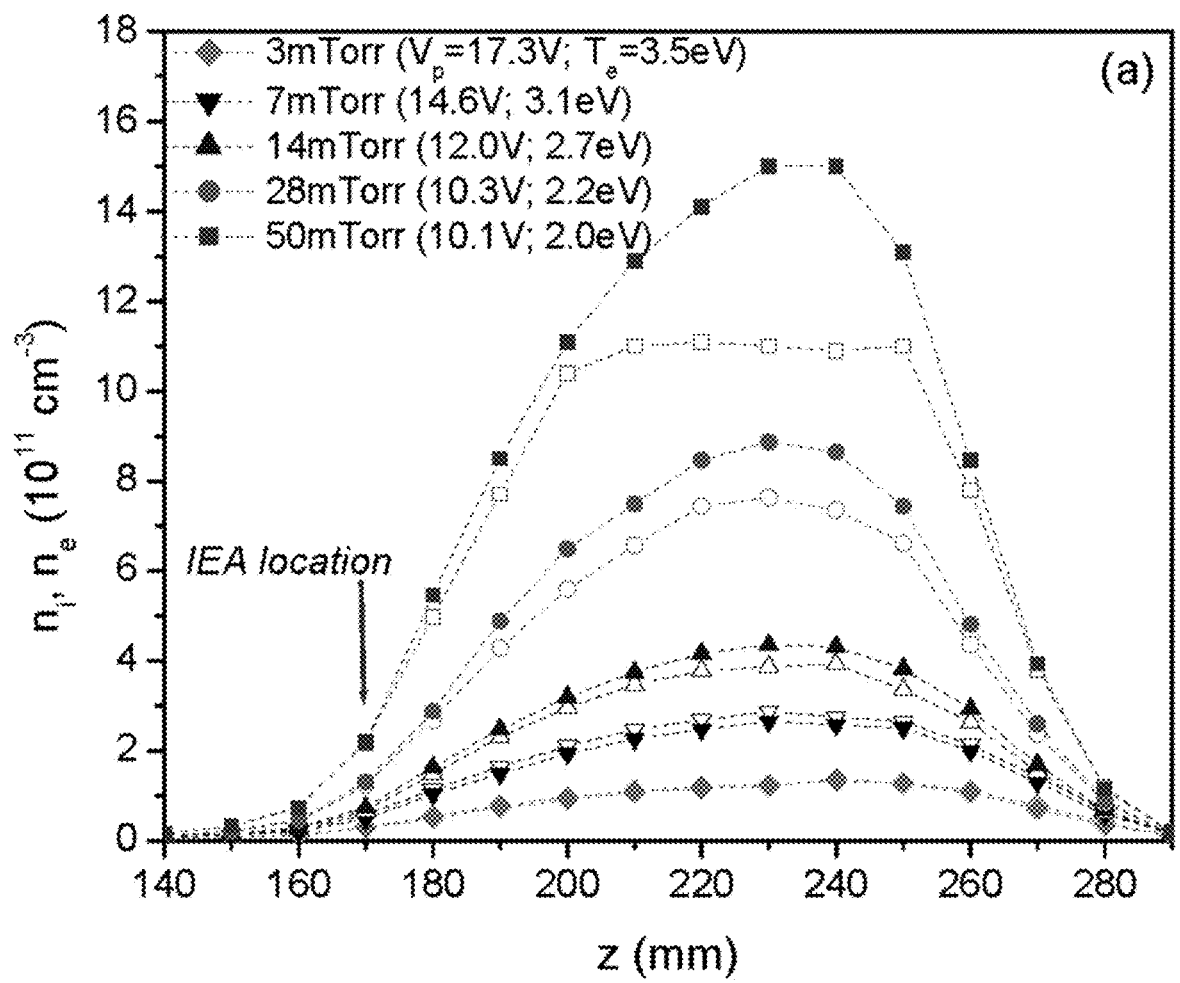
FIG. 9 illustrates ion and electron densities as a function of vertical position along the discharge tube axis.

FIG. 9 shows ion and electron densities as a function of vertical position along the discharge tube axis, measured by the Langmuir probe (LP), for different pressures. Charge density reaches a maximum around the middle of the coil and increases with pressure. A maximum ion density of $1.5 \times 10^{12}/cm^3$ is reached for a pressure of 50 mTorr. As mentioned above, ion-neutral collisions in the probe sheath will cause the positive ion density to be increasingly underestimated at higher pressures; hence the positive ion density could substantially exceed the value recorded at 50 mTorr. The electron and ion density are nearly equal for pressures of 3, 7, and 14 mTorr. For 28 mTorr, and especially near the center at 50 mTorr, the electron density was lower than the corresponding ion density. This was attributed to the fact that as the probe was biased near $V_P$, a large electron current was drawn out of the plasma. Apparently, the grounded surface of the boundary electrode in contact with the plasma was not high enough to compensate for the electron loss at these high densities. The Langmuir probe has a reference electrode that senses this imposed shift in $V_P$ and corrects for it, but only up to the point that the maximum positive voltage on the probe is reached before the correct $V_P$ is observed. $V_P$ and Te measured by the Langmuir probe at z=170 mm are shown in parenthesis next to each corresponding pressure. With the Langmuir probe removed, the RFEA was positioned at z=170 mm. IEDs measured without any applied bias, for cw plasmas at 300 W power and pressures of 7 to 50 mTorr, were single peaked at energies nearly equal to VP, as measured with the Langmuir probe.

Optical Emission Spectroscopy for Time-Resolved Detection of Etching Products:

Optical emission spectroscopy can be used to monitor the time-dependence of etching products chemically sputtered from the surface during the energetic ion flux pulses. For Si ALET with chlorine, we anticipate that the emission from Si, SiCl and $SiCl_2$ products will be observed, as was found in pulsed laser-induced thermal desorption in $Cl_2$ plasmas. (Si and SiBr emissions were also found in HBr plasmas). For GaN etching, strong emission is expected from Ga and GaCl. If $N_2$ is a primary product of GaN etching, then it can be easily detected in the plasma via $N_2$ optical emission. In addition to laser-induced fluorescence excited by a resonance between the laser frequency and excited states of SiCl and SiBr, emissions from all these species are excited by electron impact of etch products (either primary or secondary, after electron-impact dissociation), and can be observed in the region close to the substrate surface. Emission from e.g., SiCl provides a measure of the chemical sputtering yield as a function of the instantaneous Cl coverage, as well as the total amount of material removed per ion pulse. This measurement can be used to control the etching rate in real time (e.g., the ion pulse durations could be adjusted to obtain a constant etching rate). Optical emission actinometry can be to measure absolute Cl densities, as demonstrated previously in several ICP systems.

Figure 10:
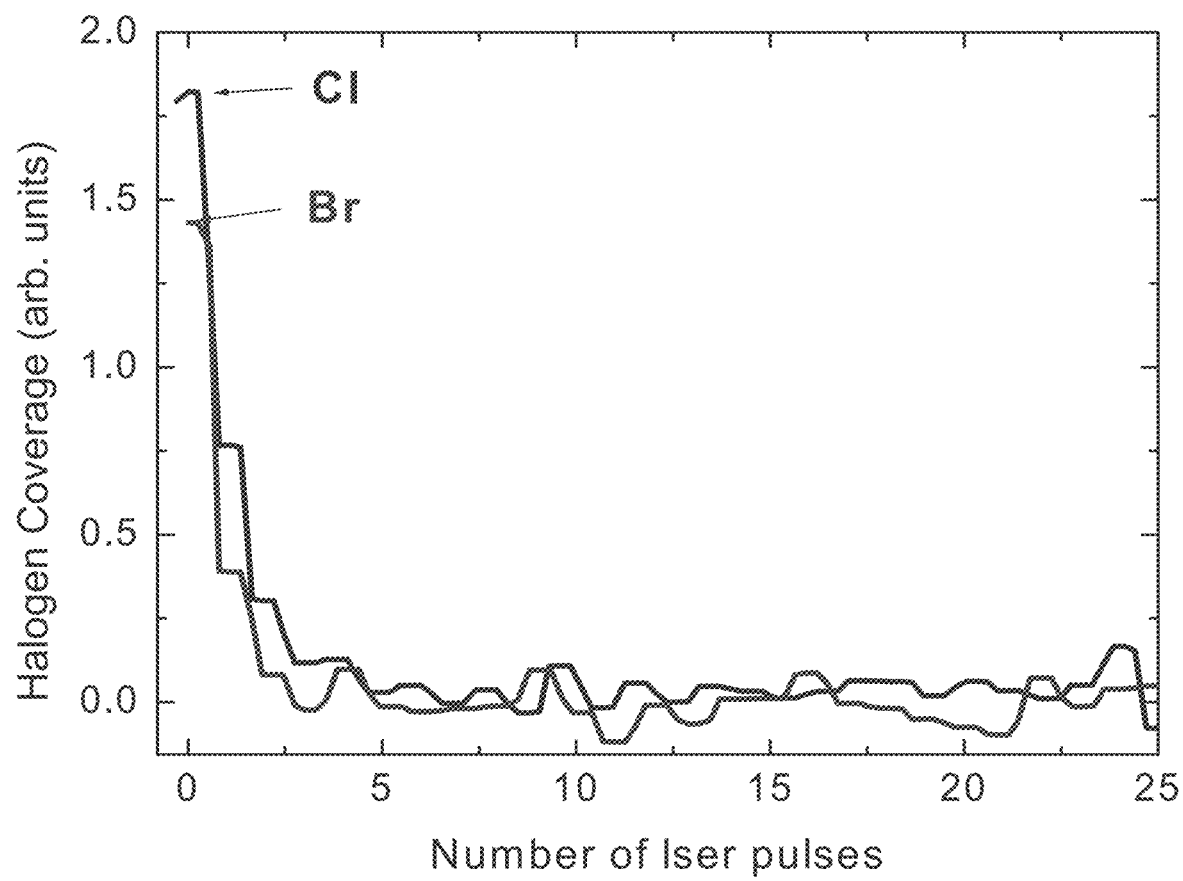
FIG. 10 illustrates a simulated SiCl and SiBr laser-induced fluorescence above a Si substrate after laser-induced thermal desorption.

In-Situ Laser-Induced Thermal Desorption (LITD):

In selected experiments, laser-induced thermal desorption are used to monitor instantaneous coverage of Cl, Br and perhaps other surface species. This method can detect 1% of monolayer coverage with a time resolution of 10 ns (the laser pulse width) as the substrate is etching in a plasma as in FIG. 10. Each laser pulse up to 80 or 5000 pulses/s with the available lasers rapidly heats the surface, resulting in a thermal desorption of typically half the Si-halide (Cl or Br) layer formed in the plasma. The surface can thus be probed as a function of time during the chemisorption step and well as during the etching step.

In-Situ XPS and In-Situ AFM/STM Surface Roughness Measurements:

After plasma exposure, samples are transferred under vacuum to an ultrahigh vacuum chamber and analyzed by XPS. Angle-resolved measurements is carried out to measure the depth of penetration of reactants such as Cl and Br and also to obtain a depth profile of Si-mono, di- and tri-halides, and the "≡Si—" moiety, a Si with 3 bonds to Si and 1 dangling bond. On masked samples, electron shadowing is used to characterize the sidewalls that are exposed to glancing angle ion bombardment. These methods have been used with this system to characterize the surface after Si etching in $Cl_2$ and HBr plasmas. In-situ characterization of the sidewalls is particularly important in the case of GaN. For this material, XPS provide a wealth of information regarding any changes in surface stoichiometry as a function of ALET process parameters. An in-situ AFM-STM instrument allows atomic resolution measurements on processed surfaces without exposure to the atmosphere. Since rapid ALET offers atomic layer accuracy, it is important to avoid even sub-monolayer coverage by atmospheric contaminants, which can distort the experimental findings. These measurements will aid in identifying process parameters that minimize surface roughness after repeated ALET cycling, leading to etching with accuracy down to one monolayer per cycle.

Figure 11:
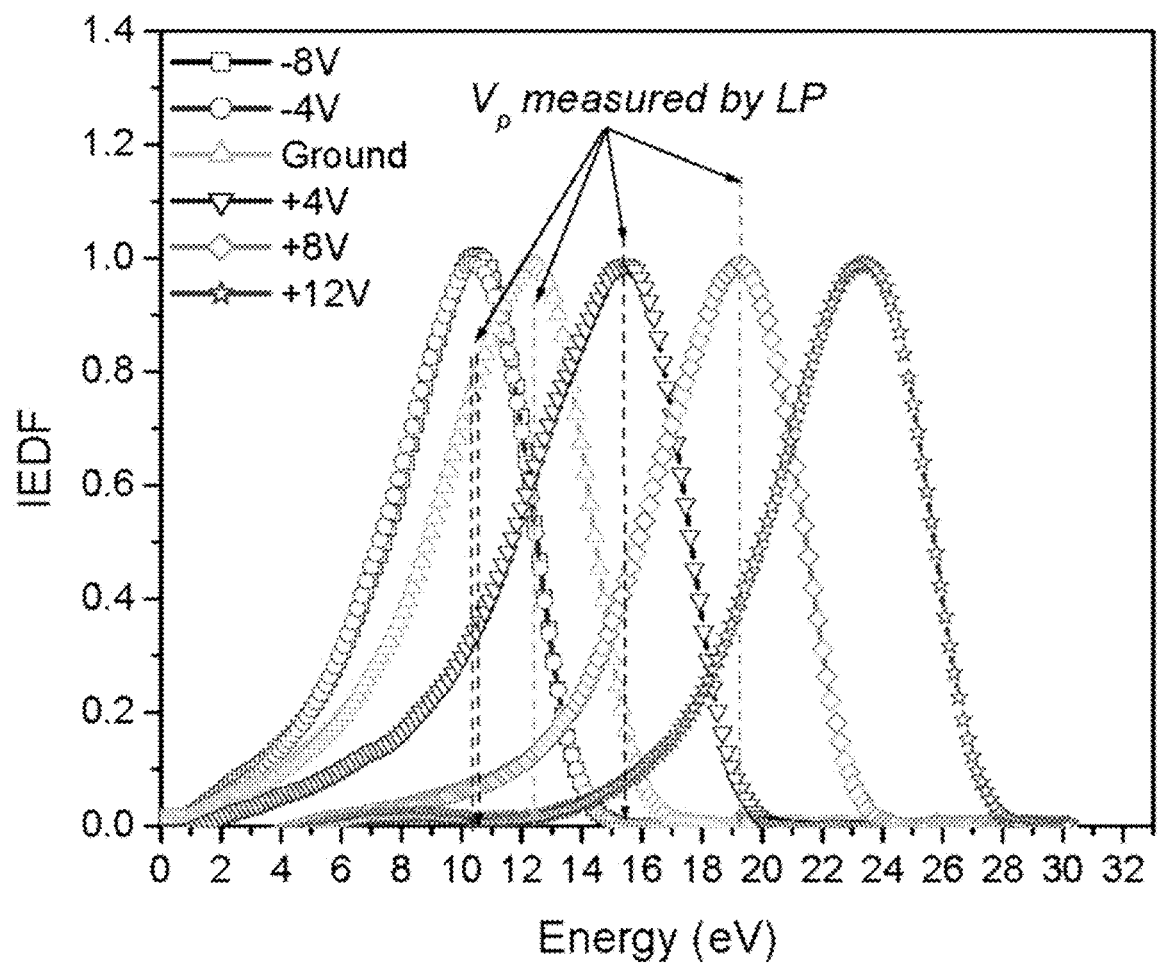
FIG. 11 illustrates IEDs at a fixed pressure for different DC bias applied continuously at the boundary electrode.

Effect of Continuous DC Bias on the Boundary Electrode:

FIG. 11 shows IEDs for 14 mTorr, 300 W, and cw-Ar plasmas for different values of DC bias, applied continuously to the boundary electrode. The values of VP measured by the Langmuir probe at the location of the RFEA for each DC bias voltage are shown in FIG. 11 by a vertical dashed line. The measured $V_P$ values are in excellent agreement with the peak energies of the IED For positive values of the DC bias, $V_P$ is raised, shifting the IED to higher energies. For negative DC bias, there is an initial small drop in $V_P$, but it saturates as the applied bias becomes more negative. When compared with measurements without DC bias, the peak of the IED shifts by 3, 7, and 11 eV for applied DC bias of 4, 8, and 12 V, respectively. The 1 V difference between the applied bias and the peak ion energy is probably due to a slight gradient of $V_P$. When a negative DC bias is applied, the shift in the peak ion energy saturates at 4 V lower than without bias. The shift in $V_P$ with the application of a DC bias on the boundary electrode is readily understood. A positive bias drains electrons from the plasma raising $V_P$ so that all but the highest energy electrons remain confined in the plasma. With the application of a small negative bias (less than a few $T_e$) $V_P$ becomes less positive as electron current to the boundary electrode is cut off. Larger negative bias on the boundary electrode causes negligible change in the ion current, hardly affecting $V_P$. The ion current saturates at large enough negative bias, assuming there is no perturbation of the plasma density or $T_e$.

Figure 12:
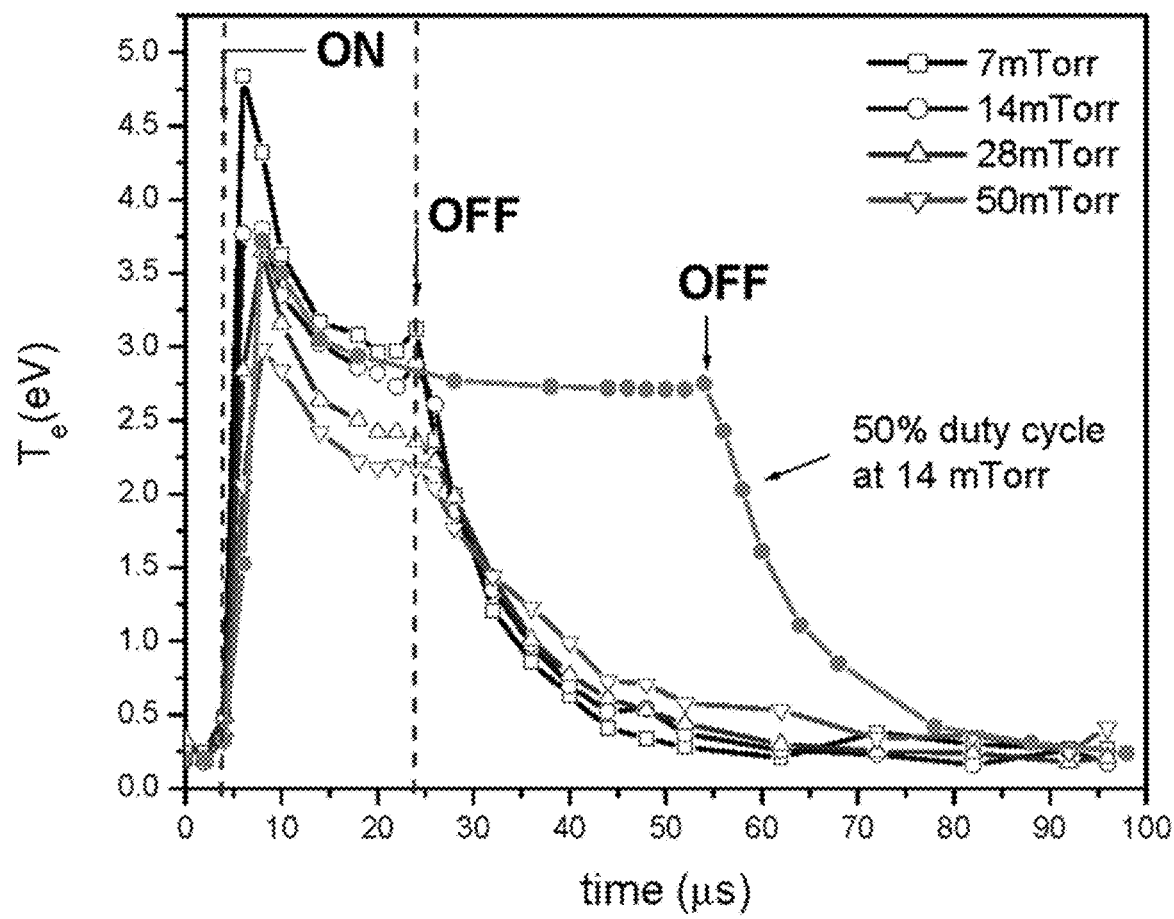
FIG. 12 illustrates resolved Langmuir probe measurements of electron temperature for different pressures.

Pulsed Plasmas:

To obtain nearly mono-energetic ion bombardment it may be desirable to reduce the energy spread of ions entering the sheath, as well as maintain a constant sheath potential. Since RF oscillations of the plasma potential are eliminated by the Faraday shield, the spread in the energy of ions entering the sheath scales with $T_e$. Hence, lowering $T_e$ should reduce the energy spread. $T_e$ can be lowered by modulating the plasma power, such as pulsed plasma. When a DC bias is applied to the boundary electrode under these conditions, ions can be accelerated to a desired energy with a narrow energy spread. FIG. 12 shows time resolved Langmuir probe measurements of electron temperature for different pressures. For a given pressure, the $T_e$ increases rapidly after the plasma is turned ON, overshoots, and then reaches a quasi steady-state value. The steady-state $T_e$ decreases with increasing pressure, as expected. After the plasma is turned OFF, $T_e$ decreases at a progressively slower rate longer into the afterglow. In addition, $T_e$ decays faster at lower pressure. In Ar plasmas, diffusion to the walls is the dominant cooling mechanism during the afterglow for electrons with energies below the lowest excited state (the $^3P_2$ metastable state at 11.55 eV). Lower pressure results in faster diffusion rates, and therefore a faster decay of Te in the afterglow.

Figure 13:
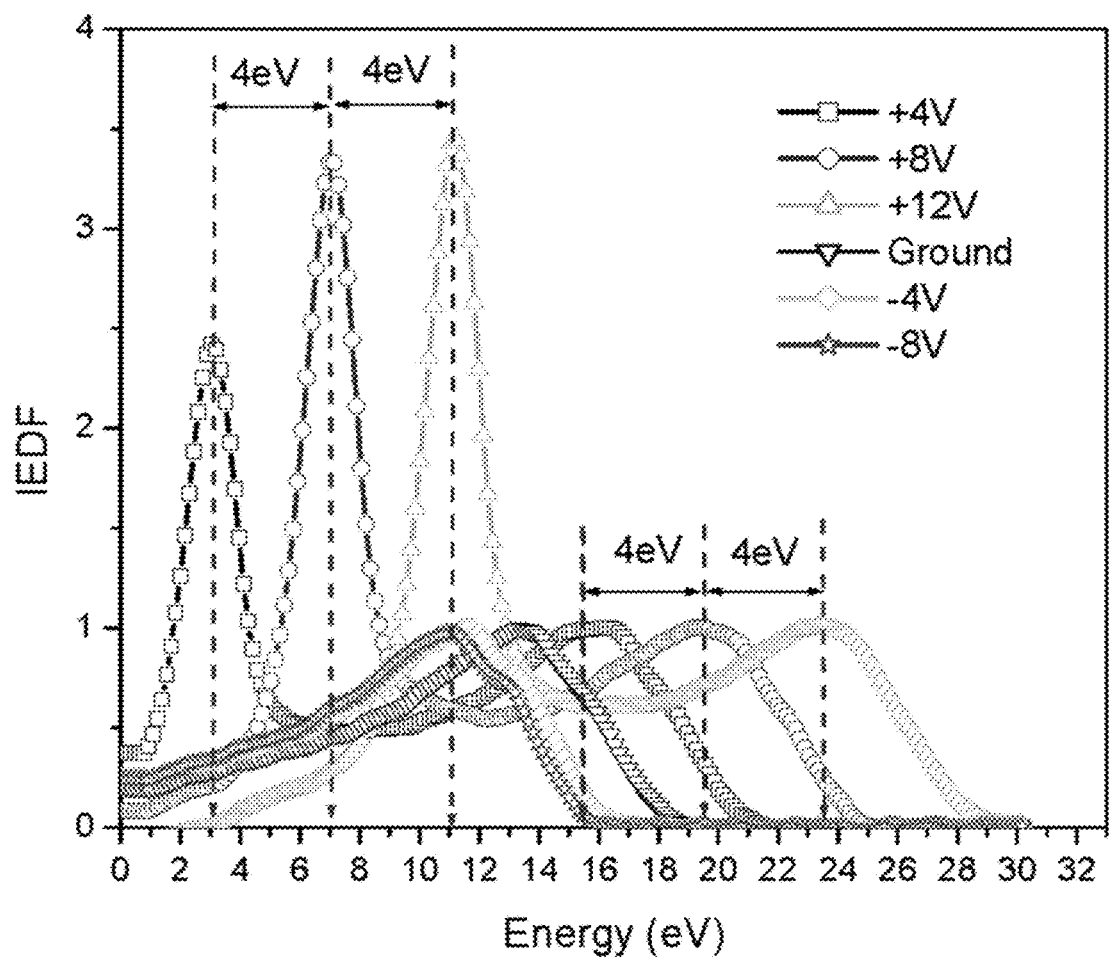
FIG. 13 illustrates normalized IEDs with DC bias applied continuous on the boundary electrode.

Continuous DC Bias on the Boundary Electrode:

FIG. 13 shows IEDs under pulsed plasma conditions, when a DC bias was continuously applied to the boundary electrode. For each value of the DC bias, the IED has two peaks. The broader peaks at higher energy correspond to ions bombarding the substrate when the plasma is ON. The shape and energy of these peaks are nearly identical to those observed in the cw plasma shown in FIG. 11. The sharper peaks at lower energy correspond to ions bombarding the substrate during the afterglow. The mean energy of these peaks corresponds to the applied DC bias. In the afterglow, $V_P$ reaches a very low value in the absence of DC bias. When a positive DC bias is applied, the plasma potential is approximately equal to that DC bias. The width of the IED is much smaller in the afterglow because of the rapid quenching of electron energy (or $T_e$). Similar results have shown a nearly mono-energetic IED by applying a DC bias in the afterglow of a pulsed capacitively-coupled plasma.

Synchronous Pulsed DC Bias on the Boundary Electrode:

While the above approach creates a narrow and tunable IED, it also leaves a broad and not well-controlled population of ions that enter the sheath during the plasma-ON portion of the cycle. One can reduce the energy of these ions below the threshold for most ion-assisted surface reactions by turning off the DC bias voltage during the plasma-ON periods. Results hereinafter are reported from pulsed plasma operation with a synchronous, pulsed positive DC bias applied to the boundary electrode at specified times during the afterglow.

Figure 14:
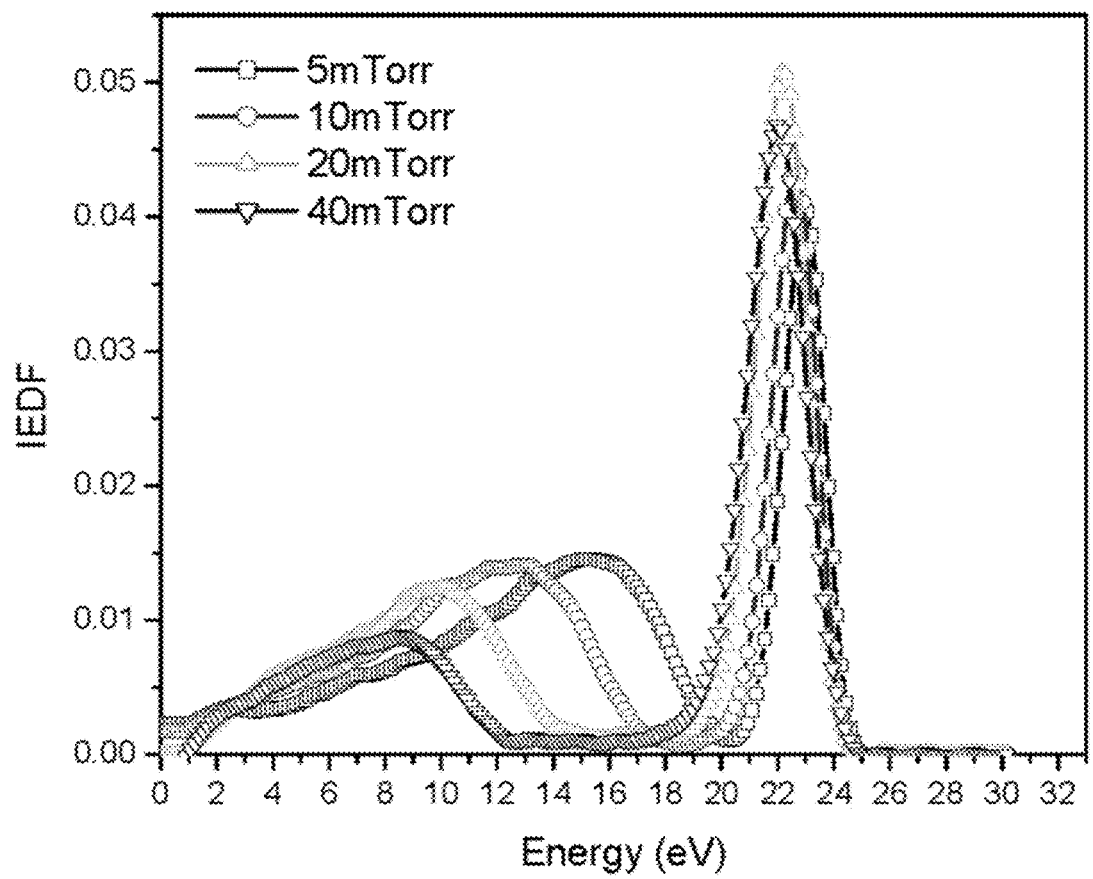
FIG. 14 illustrates IEDs at different pressures under pulsed plasmas conditions.

Effect of Pressure:

The IEDs measured by applying a synchronous bias of +24.4 VDC in the afterglow, during the time window $\Delta tb=45$-95 ms, for different values of pressure are shown in FIG. 14. The sharp peaks at ~22-23 V correspond to the DC bias, while the broader peaks at lower energy arise from the plasma ON portion of the cycle. The broader peaks shift to lower energy as pressure increases, due to a concomitant decrease in $T_e$ as in FIG. 9 and hence $V_P$. The most important aspect of the two-peaked IEDs shown in FIG. 14 is that the spacing between a broad peak and the corresponding sharp peak can be varied by varying the DC bias and reactor pressure. Such control is critical for achieving very high selectivity of etching a film relative to the underlying substrate. The pressure can be chosen so that the low energy peak produces no etching. The DC bias can be chosen such that the high energy peak lies between the thresholds of etching the film and etching the substrate, assuming there is sufficient separation between these two thresholds. The fraction of ions under each peak can also be optimized by varying the duty cycle of the pulsed plasma and/or the length of time in the afterglow during which the DC bias is applied, as discussed next.

Figure 15:
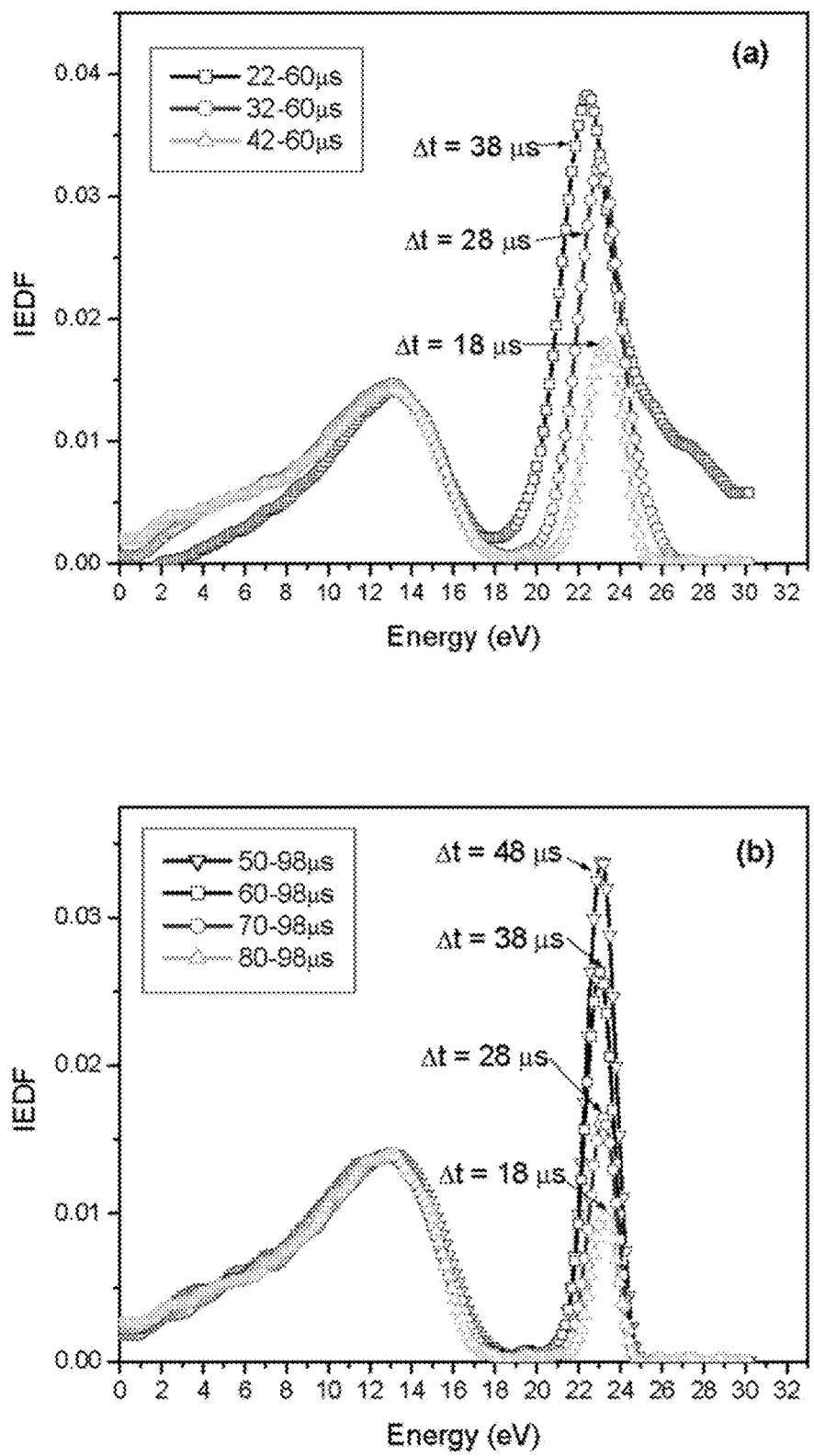
FIG. 15 illustrates IEDs with a synchronous DC bias boundary electrode pulses at different times during the afterglow of pulsed plasma, and where (a) is graph for bias starting in the early afterglow and (b) is the graph for bias starting in the late afterglow.

Effect of Bias Timing in the Afterglow:

IEDs in the afterglow were also measured with a synchronous DC bias (+24.4 V) applied to the boundary electrode for different start times (tb) and time windows ($\Delta tb$). The pulsed plasma was generated with 120 W average power at 10 kHz and 20% duty cycle, 14 mTorr, and 40 sccm Ar flow rate. IEDs with the DC bias applied in the early afterglow and late afterglow are shown in FIGS. 15(a) and (b), respectively. In FIG. 15(a) biasing starts at progressively later times in the afterglow and ends 60 ms into the pulse, or 40 ms into the afterglow, thus $\Delta tb$ varies from 18 to 38 ms. As in FIG. 14, the higher energy peaks correspond to the applied bias, whereas the lower energy peaks correspond to $V_P$ without bias. When biasing starts at tb=22 ms, only 2 ms after plasma turn OFF, $T_e$ is still high as in FIG. 12 resulting in a broader width of the respective high energy peak. As tb is delayed further into the afterglow, $T_e$ decreases and so does the width of the higher energy peaks of the IED In FIG. 15(b) biasing starts deep into the afterglow when $T_e$ changes little with time, as in FIG. 12. Therefore, the width of the IED is hardly affected by the biasing starting time tb. In both FIGS. 15(a) and (b), the collected ion current is larger as $\Delta tb$ increases.

Figure 16:
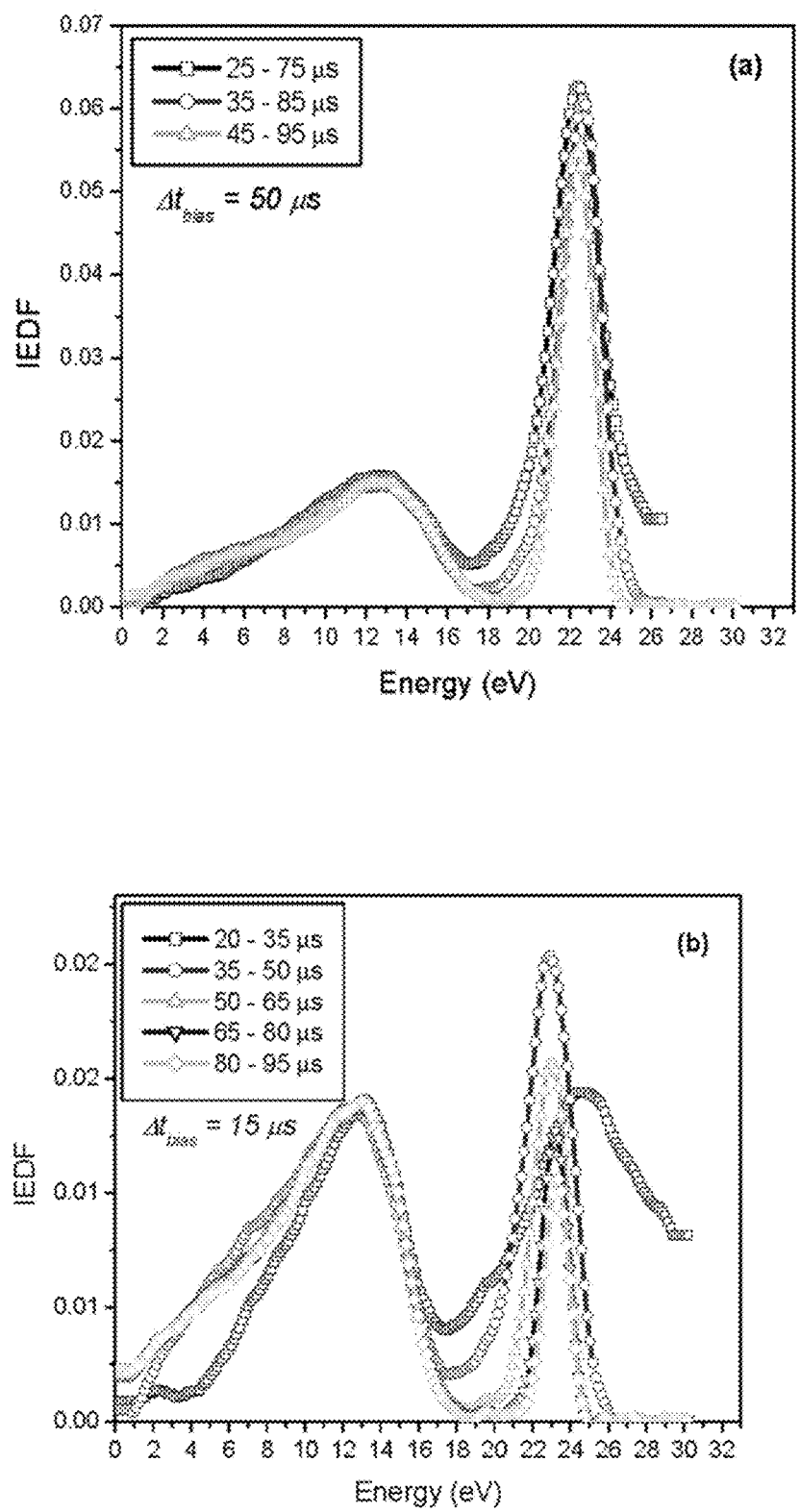
FIG. 16 illustrates graphs of IEDs with a synchronous DC bias boundary electrode pulses at the same time during the afterglow of pulsed plasma, and where (a) is the graph for the bias duration Δtb=50 microseconds and (b) is the graph for the bias duration Δtb=15 microseconds.

In FIG. 16 the bias starting time tb was varied while keeping a constant $\Delta tb$ of 50 µs or 15 µs. The average power into the pulsed plasma was 120 W. When the biasing window is long, 50 µs, compared to the $T_e$ decay time, ~10 µs, the biasing starting time hardly affects the ion energy distribution as send in FIG. 16(a). This is because the average $T_e$ over these bias windows is low and roughly equal. When $\Delta tb$ is short, 15 µs, however, a biasing starting time in the early afterglow (tb=20 µs) results in a broad IED peak as shown in FIG. 16b. The width of the IED diminishes progressively, as tb is shifted to later times in the afterglow. Again, the width of the IED correlates with $T_e$ during the corresponding biasing window.

Figure 17:
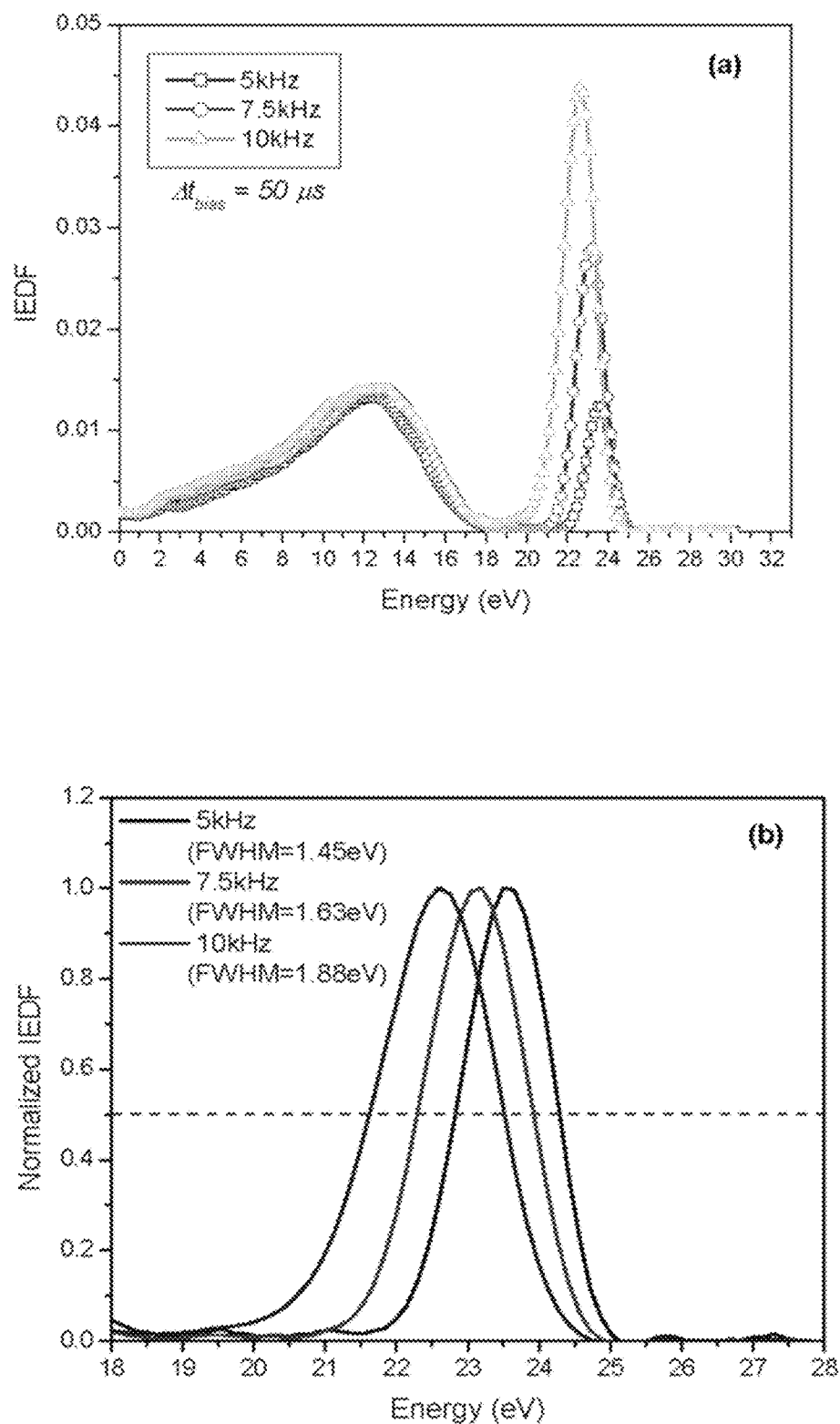
FIG. 17 illustrates graphs of IEDs with a synchronous DC bias during the afterglow of a pulsed plasma for different plasma modulation frequencies, where (a) is the graph for bias duration Δtb=50 μs and (b) the graph of normalized IEDs with FWHM.

Further experiments were conducted varying the plasma power modulation frequency (5, 7.5, and 10 kHz) while keeping a constant Δtb=50 μs as shown in FIG. 17. The pulsed plasma was generated at 14 mTorr Ar pressure with a 20% duty cycle, and an average power of 120 W. As the modulation frequency decreases, keeping the same duty cycle, the duration of both the active glow and the afterglow increase. In this case, tb was 145 μs, 75 μs, and 45 μs for modulation frequency of 5 kHz, 7.5 kHz and 10 kHz, respectively. For all three modulation frequencies, the low energy peaks are nearly identical because the duration of the active glow is long compared to the decay time for $T_e$ and therefore $V_P$. On the other hand, the higher energy peak becomes narrower and smaller as the modulation frequency decreases because the plasma decays for a longer period at a lower modulation frequency, resulting in a lower $T_e$. The narrowing of the FWHM of the peak with decreasing modulation frequency is more clearly shown by the normalized curves of FIG. 17(b).

Figure 18:
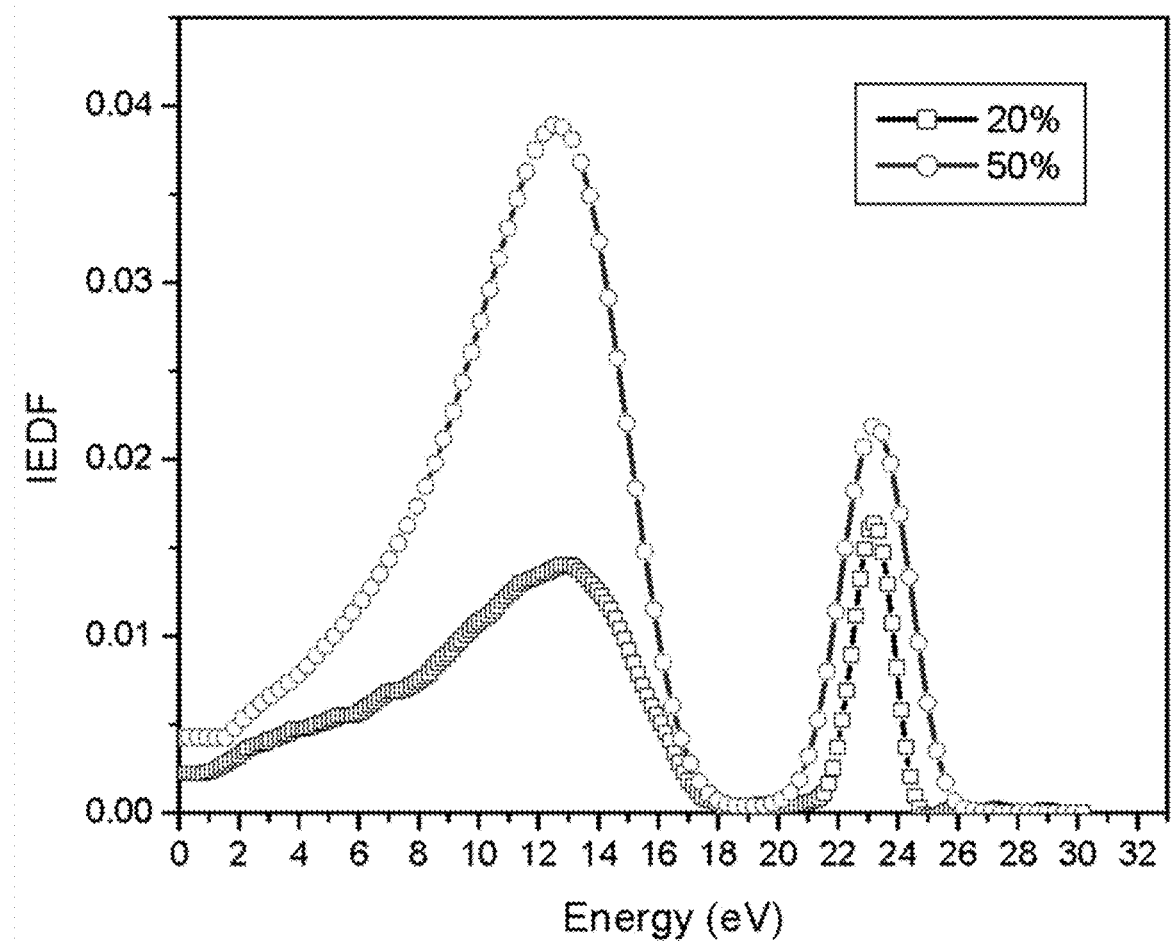
FIG. 18 illustrates the graph of IEDs with a synchronous DC bias boundary electrode pulses during the afterglow of pulsed plasma for different duty cycles.

The IEDs for 14 mTorr Ar pulsed plasmas at two different duty cycles (20 and 50%) are shown in FIG. 18. A synchronous DC bias of +24.4 V was applied from 70 to 98 μs in the afterglow. The average power was 120 W and 280 W for 20% and 50% duty cycle, respectively at 10 kHz modulation frequency. The area under the peaks is higher for the longer duty cycle. The higher energy peak has a smaller width for 20% duty cycle since the plasma decays for longer time resulting in a lower $T_e$ and $V_P$. Unlike the 20% duty cycle case, $T_e$ is still considerably high during the application of bias for the 50% duty cycle, as shown in FIG. 12, resulting in a residual $V_P$ is as high as 3.7 V, compared to only 1.9V for the 20% duty cycle. This difference in the residual $V_P$ explains the different widths of the respective IEDs in FIG. 18. The area under the peak of the IED is proportional to the ion charge collected during the biasing window. This charge was estimated using the Bohm flux of ions $J_o$=e ns uB (where ns is the ion density at the sheath edge and uB is the Bohm velocity), and the known biasing times. Using the measured ion density nb (ns=0.6 nb) and electron temperature averaged over the duration of the bias, the estimated ion charge was indeed found to be proportional to the area under the respective peaks of FIGS. 15-18.

Energy Spread of the IED:

The full width at half maximum (FWHM) of the peaks corresponding to the applied DC bias increases with pressure from 1.7 eV at 7 mTorr to 2.5 eV at 50 mTorr in FIG. 14. These peaks are much tighter than those of the ions from the active glow with no bias, though still broader than the energy resolution of the RFEA. The latter was estimated to be DE/E ~2%, or a FWHM of 0.5 eV for E=25 V. Collisions in the differentially pumped RFEA can be ignored, since the local pressure was about two orders of magnitude lower that the discharge pressure, making the ion mean free path, ~15 cm corresponding to the highest plasma pressure used, much longer than the analyzer length of ~1 cm. Some ion-neutral collisions do occur in the sheath. These could contribute to the "tail" of the IED to the left of the peaks at higher pressures, but are not expected to be the major cause of the observed widths of 1.7 to 2.5 eV in the afterglow. For instance, the ion mean free path at 14 mTorr is about $\lambda_i$=0.2 cm which is a factor of 10 larger than the sheath width ~250 μm, estimated from the Child law. This results in an ion collision probability $P_c$=1−exp(−s/$\lambda_i$) of ~10%. Note that the plasma density increases strongly with pressure, causing the sheath width to decrease, counteracting the decrease in mean free path with pressure. Ion-neutral collisions in the pre-sheath can contribute significantly to the spread of the IED. Depending on the ion collision affects, the FWHM of the IED can be several $T_e$.

We claim:

1. A method for etching a substrate, comprising:
   introducing a feed gas into a plasma chamber, the feed gas comprising a mixture of inert gas and reactant gas;
   disposing the substrate in the plasma chamber;
   generating a plasma from the feed gas, the plasma containing reactants and ions;
   saturating a substrate surface with the reactants to form a product layer, the product layer comprising a monolayer of the reactant species and a first monolayer atoms of the substrate; and
   removing the product layer by exposing the product layer to the ions.

2. The method according to the claim 1, wherein the generating and the saturating occurs during a first period and the removing occurs during a second period.

3. The method according to claim 2, wherein the plasma source is applied with a first RF power level during a first portion of the first period.

4. The method according to claim 3, wherein the plasma source is turned off during a second portion of the first period.

5. The method according to claim 3, wherein the plasma source is applied with RF power pulses during the second period, the RF power pulses having a second RF power level greater than the first RF power level.

6. The method according to claim 5, wherein the electrode is applied with bias pulses during the second period, wherein the RF power pulses and the bias pulses applied during the second period alternate sequentially, and wherein at least one of the bias pulses is removed from at least one of the RF pulses by about 10 μs.

7. The method according to claim 6, wherein the electrode is applied with positive bias pulses during the second period, wherein the electrode provides positive bias pulses to the plasma.

8. The method according to claim 6, wherein the electrode is applied with negative bias pulses during the second period, and wherein the electrode is electrically coupled to the substrate to provide the negative bias pulses to the substrate.

9. The method according to claim 1, wherein the removing the product layer is performed by increasing potential difference between the plasma and the substrate so as to direct the ions from the plasma toward the substrate.

10. The method according to claim 9, wherein the increasing the potential difference is performed by at least one of applying positive voltage to the plasma and applying negative voltage to the substrate.

11. The method according to claim 1, wherein the feed gas is continuously introduced into the chamber.

12. A method for processing a substrate comprising:
    directing ions from plasma afterglow, toward a substrate surface saturated with a first substance; and
    removing the first substance and a monolayer of substrate atoms with the ions.

13. The method according to claim 12, wherein the first substance comprises reactant species.

14. The method according to claim 12, further comprising:
    providing pulsed RF power to the plasma, wherein the directing the ions is performed between the RF pulses.

15. The method according to claim 12, wherein the directing the ions is performed by providing bias pulses to an electrode near the substrate, wherein the bias pulses applied to the electrode and the RF power pulses applied to the plasma source alternate sequentially.

\* \* \* \* \*

UNITED STATES PATENT AND TRADEMARK OFFICE
CERTIFICATE OF CORRECTION

PATENT NO. : 10,515,782 B2
APPLICATION NO. : 15/949274
DATED : December 24, 2019
INVENTOR(S) : Vincent M. Donnelly and Demetre J. Economou Page 1 of 1

It is certified that error appears in the above-identified patent and that said Letters Patent is hereby corrected as shown below:

In the Specification

The Statement Regarding Federally Sponsored Research or Development in Lines 19-25 should read as follows:
--STATEMENT REGARDING FEDERALLY SPONSORED RESEARCH OR DEVELOPMENT
This invention was made with government support under grant number DE-SC0000881 awarded by the Department of Energy. The government has certain rights in the invention.--

Signed and Sealed this
Seventeenth Day of June, 2025

Coke Morgan Stewart
*Acting Director of the United States Patent and Trademark Office*